(12) United States Patent
Bernstein et al.

(10) Patent No.: US 6,989,921 B2
(45) Date of Patent: Jan. 24, 2006

(54) MAGNETICALLY ACTUATED MICRO-ELECTRO-MECHANICAL APPARATUS AND METHOD OF MANUFACTURE

(75) Inventors: Jonathan Bernstein, Medfield, MA (US); William P. Taylor, North Andover, MA (US); Gregory A. Kirkos, Somerville, MA (US); Marc Waelti, East Hampstead, NH (US)

(73) Assignee: Corning Incorporated, Corning, NY (US)

( * ) Notice: Subject to any disclaimer, the term of this patent is extended or adjusted under 35 U.S.C. 154(b) by 418 days.

(21) Appl. No.: 09/939,422

(22) Filed: Aug. 24, 2001

(65) Prior Publication Data

US 2002/0050744 A1 May 2, 2002

Related U.S. Application Data

(60) Provisional application No. 60/276,815, filed on Mar. 16, 2001, provisional application No. 60/228,332, filed on Aug. 27, 2000.

(51) Int. Cl.
G02B 26/00 (2006.01)
(52) U.S. Cl. ..................................... 359/290; 359/223
(58) Field of Classification Search ................ 359/223, 359/224, 225, 290, 291, 295, 318, 239, 298, 359/302, 315, 850, 871, 872, 877, 226; 385/55, 385/85, 108, 111
See application file for complete search history.

(56) References Cited

U.S. PATENT DOCUMENTS

| | | | | |
|---|---|---|---|---|
| 4,421,381 A | * | 12/1983 | Ueda et al. .................. | 359/214 |
| 5,606,447 A | * | 2/1997 | Asada et al. ................ | 359/199 |
| 5,648,618 A | * | 7/1997 | Neukermans et al. ..... | 73/862.08 |
| 5,748,172 A | * | 5/1998 | Song et al. ................. | 345/111 |
| 5,912,608 A | | 6/1999 | Asada ......................... | 335/222 |
| 6,044,705 A | * | 4/2000 | Neukermans et al. ..... | 73/504.02 |
| 6,295,154 B1 | * | 9/2001 | Laor et al. .................. | 359/223 |
| 6,369,400 B1 | * | 4/2002 | Haeberle et al. ............ | 250/548 |
| 6,467,345 B1 | * | 10/2002 | Neukermans et al. ..... | 73/504.02 |
| 6,483,962 B1 | * | 11/2002 | Novotny ...................... | 385/18 |
| 6,593,677 B2 | * | 7/2003 | Behin et al. ................ | 310/309 |

FOREIGN PATENT DOCUMENTS

JP  60-107017  6/1985

* cited by examiner

*Primary Examiner*—Georgia Epps
*Assistant Examiner*—Joseph Martinez
(74) *Attorney, Agent, or Firm*—Wilmer Cutler Pickering Hale and Dorr LLP

(57) ABSTRACT

An array of magnetically actuated MEMS mirror devices is provided having stationary magnets configured to provide strong magnetic fields in the plane of the mirrors without any magnets or magnet-system components in the plane of the mirrors. Also, a magnetically actuated mirror device is provided that includes an improved actuation coil configuration that provides greater torque during mirror actuation. In addition, a mechanism is provided to detect the angular deflection of a moveable mirror. Also, an improved process is provided for manufacturing MEMS mirror devices.

41 Claims, 25 Drawing Sheets

US 6,989,921 B2

MAGNETICALLY ACTUATED MICRO-ELECTRO-MECHANICAL APPARATUS AND METHOD OF MANUFACTURE

RELATED APPLICATIONS

The present application is based on and claims priority from provisional patent application Ser. No. 60/276,815 filed on Mar. 16, 2001 and provisional patent application Ser. No. 60/228,332 filed on Aug. 27, 2000.

BACKGROUND OF THE INVENTION

1. Field of the Invention

The present invention relates generally to micro-electromechanical (MEMS) devices and, in particular, to arrayed magnetically actuated MEMS devices such as arrayed mirrors used in optical switches.

2. Description of Related Art

FIG. 1 schematically illustrates an example of an optical cross-connect 12 of an optical switch. The cross-connect 12 includes an array of collimators or other beam-forming devices, represented by grid 14, and forms incoming optical communications signals into beams that impinge on an array of selectively moveable reflectors or mirrors represented by grid 16. Each beam from grid 14 has its own corresponding moveable mirror on grid 16.

The moveable mirrors of grid 16 are controllably positioned so as to individually direct the respective beams from grid 14 to respective moveable mirrors of a second array of moveable mirrors, represented by grid 18. The moveable mirrors of grid 18 are positioned so as to individually direct the beams received from grid 16 to respective beam receivers of an array of beam receivers represented by grid 20. The beam receivers may take various forms, such as transducers, lenses or optical elements for coupling the respective beams into respective optical fibers, waveguides, or the like. As with grids 14 and 16, each moveable mirror of grid 18 is associated with a particular beam receiver of grid 20, so that each receiver receives beams on a single axis. A representative signal path from grid 14 to grid 20 is indicated by arrow 22.

Attempts have been made previously to fabricate arrays of mirrors such as those represented by grids 16 and 18 using MEMS technology, in which silicon processing and related techniques common to the semiconductor industry are used to form micro-mechanical devices. For switches such as that shown in FIG. 1, it is desirable to have an array of moveable mirrors that are both densely packed and easily controlled.

As is known in the art, movable mirrors can be actuated or controlled in a variety of ways including through electromagnetic actuation, electrostatic actuation, piezoelectric actuation, stepper motors, thermal bimorph and comb-drive actuation.

FIG. 2 illustrates an electro-magnetically actuated singlemirror device 30 in accordance with the prior art. The mirror device 30 includes a mirror 32 movably supported on a gimbal structure 34. The mirror 32 includes a reflective surface 33, which is on the same side of the mirror as the actuation coils.

The device 30 has an inner coil 36 on the mirror 32, and an outer coil 38 on a gimbal frame. An external magnetic field B oriented at 45 degrees to the X and Y axes provides torque when either the inner or outer coils are actuated with current, thereby causing the mirror 32 to rotate about respective torsional hinges or flexures 40, 41 as desired.

The mirror device 30 accordingly has two axes of actuation (about the inner and outer hinges 40, 41) that are non-orthogonal to the applied magnetic field. Non-orthogonal actuation consumes greater power (or requires stronger magnetic fields) since the coil torques interfere with each other. This also complicates control of the device. In addition, the coils require space and reduce the area available for the mirror. Smaller mirrors cannot intercept as much of the desired optical beam, causing higher insertion loss. Alternatively, larger mirrors can be used, but with reduced packing density.

The magnetic field applied to mirror devices of the type shown in FIG. 2 is provided in the prior art by magnets positioned in the plane of the mirror. As shown, e.g., in FIG. 3, a mirror device 42 includes magnets 44 in the plane of the mirror 32. A strong magnetic field is needed at the plane of the mirror and gimbal to minimize the current needed to deflect the mirror, thereby reducing power consumption and heating of the mirror. The magnets 44 are accordingly relatively large. A frame 46 of soft magnetic material can be provided to intensify the field. The relatively large magnets and frame make it difficult to have multiple mirrors of this type positioned close to each other in an array.

Other known mirror actuators also have drawbacks. For example, currently available electrostatic devices require large voltages and have a nonlinear rotation angle vs. applied voltage relationship. In addition, small gaps are needed in these devices, which can become clogged with particles. Also, electrostatic actuation currently provides only very weak forces for large displacements or strong forces for only small displacements, whereas electromagnetic actuation can produce large forces over large displacements.

Piezoelectric actuators have very small deflection angles or exert extremely small forces (bimorphs) or both. Stepper motors are very large and typically consume more power. Thermal actuators have a slow response time, are sensitive to ambient temperature, are energy inefficient and consume large amounts of power. Heat spreading from adjacent devices causes thermal cross-talk.

A need accordingly exists for an array of mirror devices that can be densely packed and easily controlled.

A need also exists for a mechanism that can be used to detect the angular position of a movable mirror.

A need further exists for improved packaging of mirror device arrays.

A need also exists for an improved method of manufacturing mirror devices.

BRIEF SUMMARY OF EMBODIMENTS OF THE INVENTION

In accordance with one embodiment of the invention, an array of magnetically actuated MEMS mirror devices is provided having stationary magnets configured to provide strong magnetic fields in the plane of the mirrors without any magnets or magnet-system components in the plane of the mirrors.

A magnetically actuated mirror device in accordance with another embodiment of the invention includes an improved actuation coil configuration that provides greater torque during mirror actuation.

In accordance with another embodiment of the invention, a mechanism is provided to detect the angular deflection of a moveable mirror.

In accordance with yet another embodiment of the invention, an improved process is provided for manufacturing MEMS mirror devices.

These and other features of various embodiments of the present invention will become readily apparent from the following detailed description wherein embodiments of the invention are shown and described by way of illustration of the best mode. As will be realized, the invention is capable of other and different embodiments and its several details may be capable of modifications in various respects, all without departing from the invention. Accordingly, the drawings and description are to be regarded as illustrative in nature and not in a restrictive or limiting sense with the scope of the application being indicated in the claims.

BRIEF DESCRIPTION OF THE DRAWINGS

For a fuller understanding of the nature and objects of the present invention, reference should be made to the following detailed description taken in connection with the accompanying drawings wherein.

DETAILED DESCRIPTION OF PREFERRED EMBODIMENTS

Magnetically Actuated Devices

Figure 1:
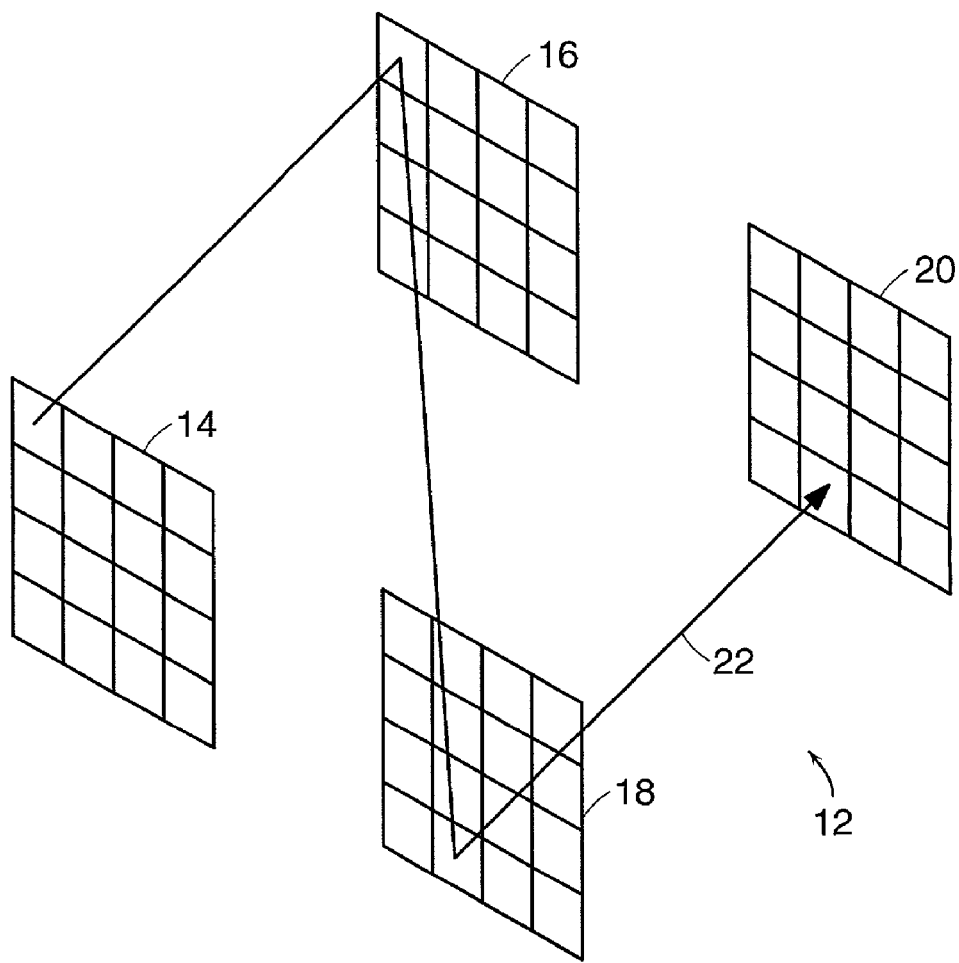
FIG. 1 is a schematic illustration of an example of an optical cross-connect.
Figure 2:
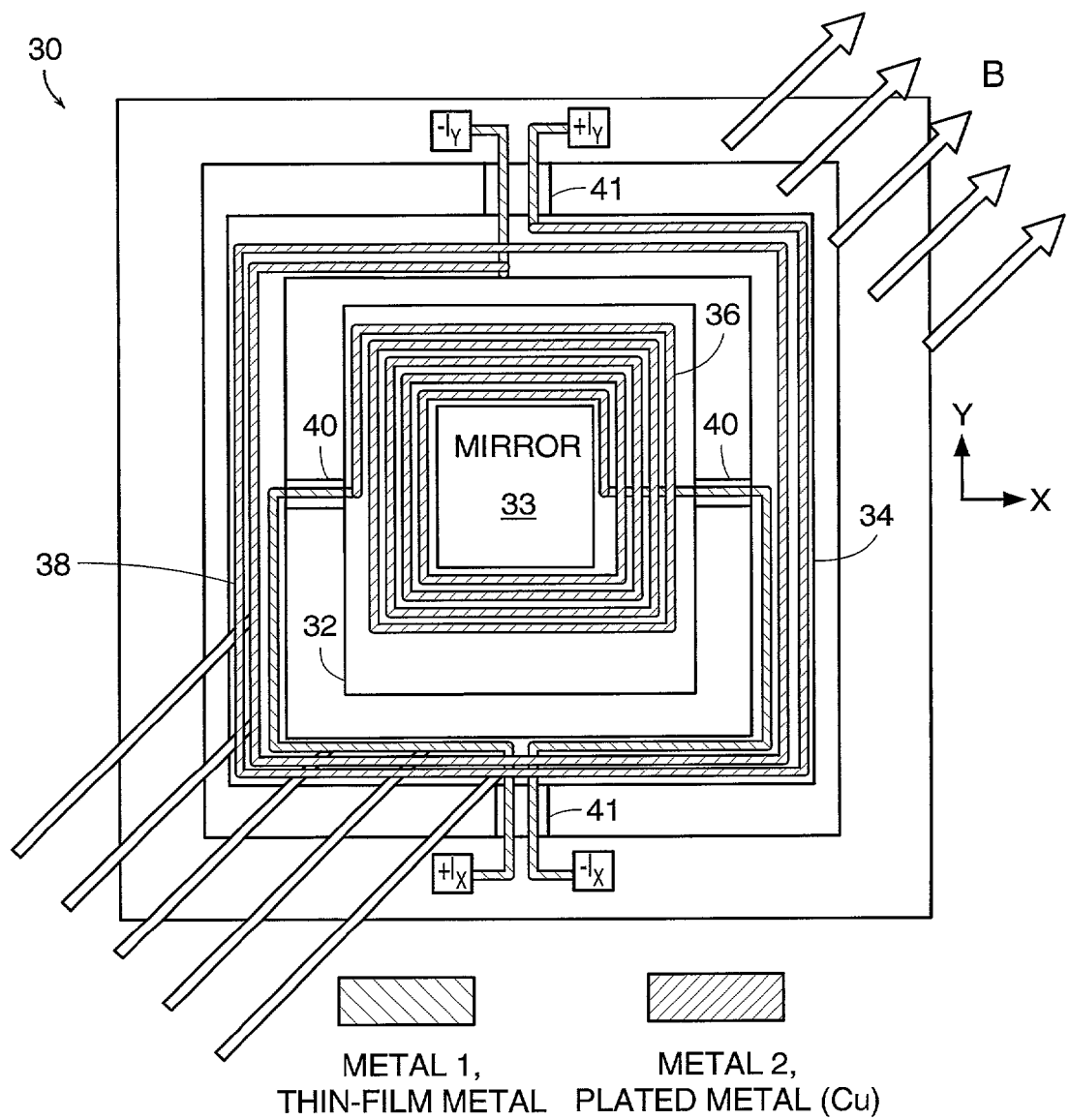
FIG. 2 is a plan view schematic diagram of a mirror device in accordance with the prior art.
Figure 3:
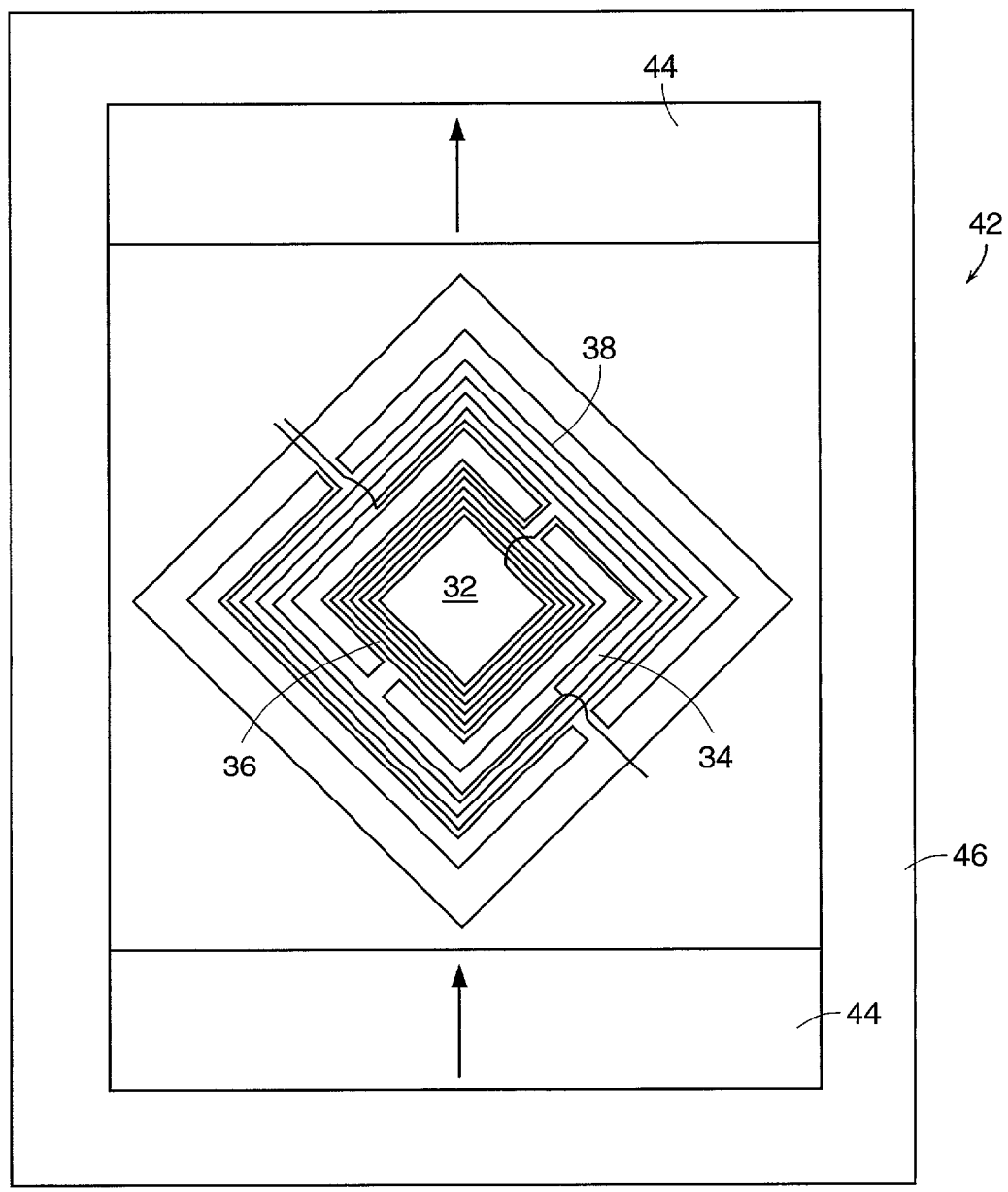
FIG. 3 is a plan view schematic diagram of a mirror device with magnets in the plane of the mirror in accordance with the prior art.
Figure 4:
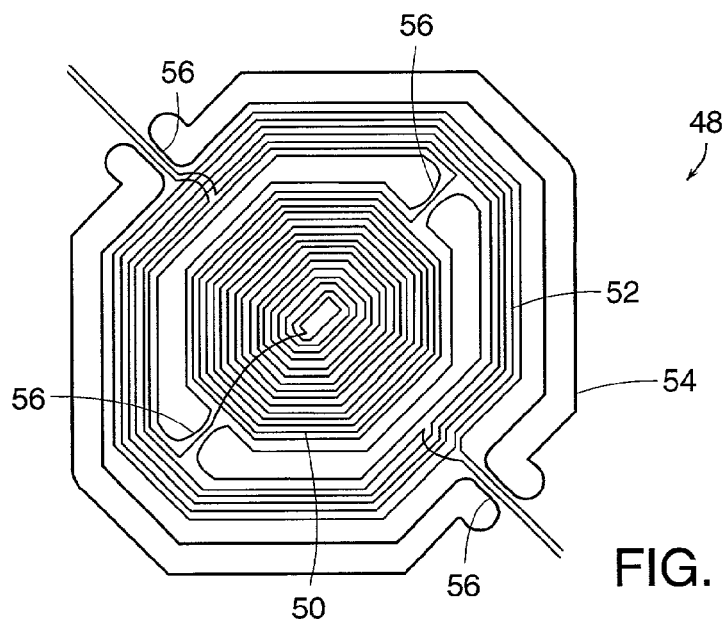
FIG. 4 is a plan view schematic diagram of a mirror device in accordance with one embodiment of the invention.

One embodiment of the present invention is directed to an array of magnetically actuated MEMS mirror devices having stationary magnets configured to provide strong magnetic fields in the plane of the mirrors without any magnets or magnet-system components in the plane of the mirrors. An example of a mirror device 48 suitable for use with the magnet configuration in accordance with this embodiment is shown in FIG. 4. The reflective surface of the mirror is opposite the surface shown. A coil 50 is formed on the surface opposite the reflective surface so as to maximize both reflective surface and coil area. A second coil 52 is formed on a gimbal frame 54 surrounding the mirror. All of the structure may be formed by known silicon-processing techniques from a single-crystal silicon wafer or from a silicon-on-insulator (SOI) wafer, or the like. The mirror and gimbal are arranged within a polygonal area (in this example, a square) with torsional hinges 56 pointed toward vertices of the polygon, thus allowing a larger central circular or oval area within the polygon for the mirror surface. The axes of the hinges 56 are neither parallel nor perpendicular to major faces of the polygonal area. Accordingly, magnetic field lines in the plane of the mirror perpendicular to a major face of the polygonal area will produce torques on the respective current loops capable of rotating the mirror and gimbal about the respective hinge axes. An array 58 of such mirror devices 48 is shown, e.g., in FIG. 5.

Figure 5:
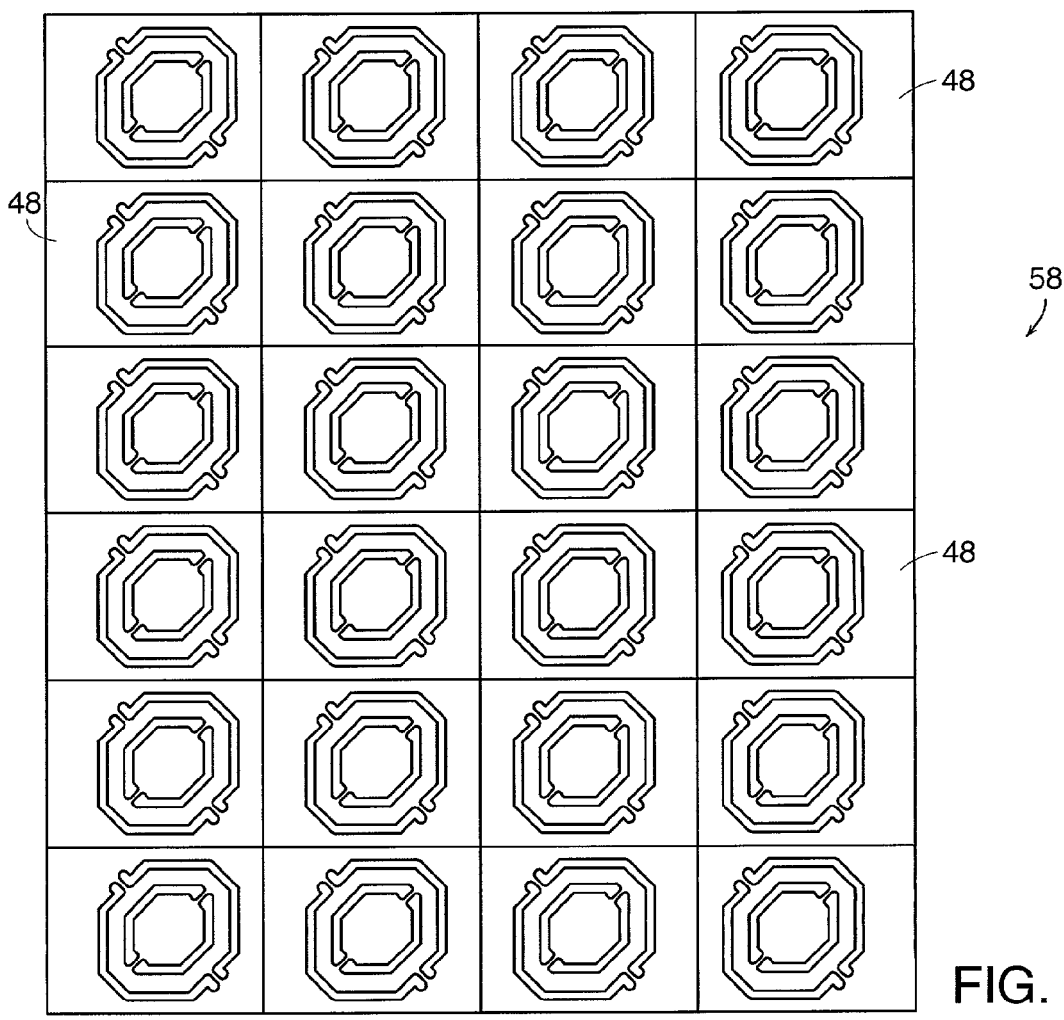
FIG. 5 is a plan view schematic diagram of an array of mirror devices shown in FIG. 4.
Figure 6:
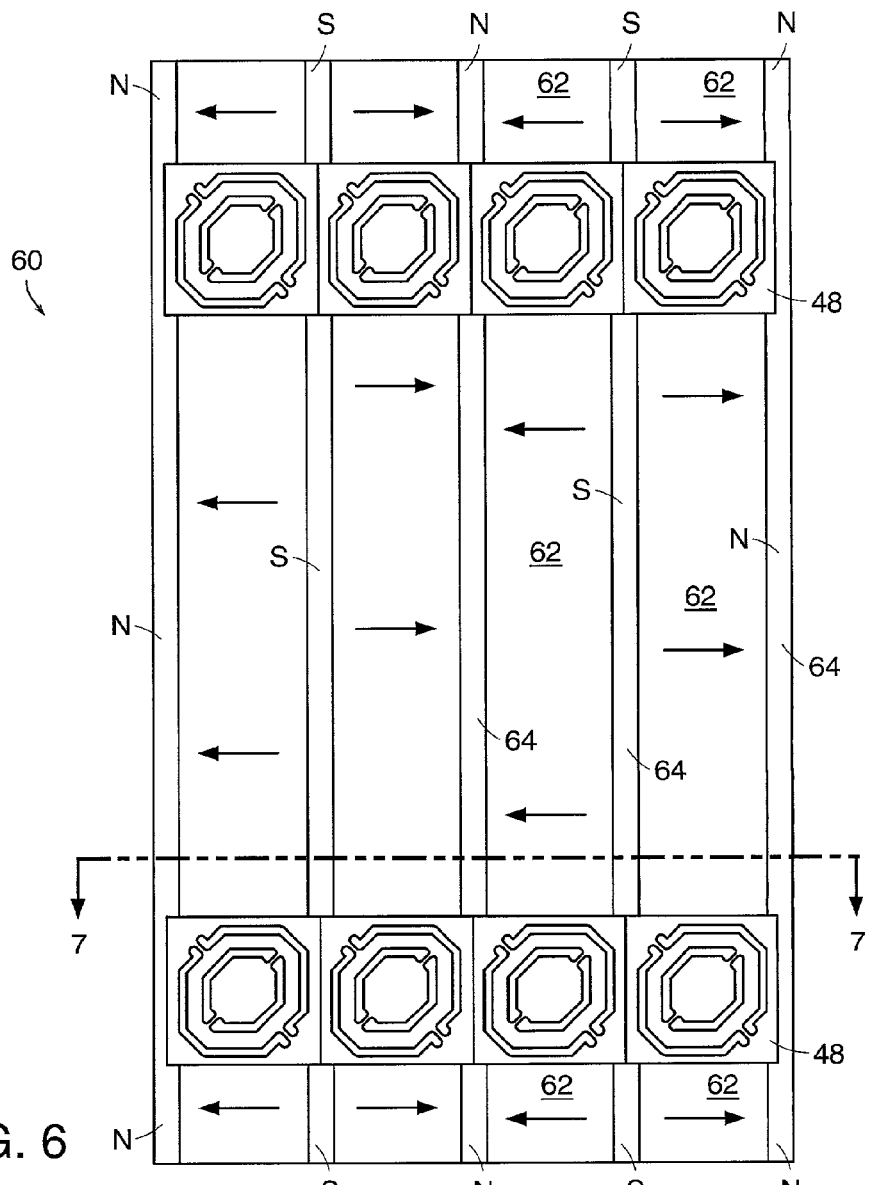
FIG. 6 is a plan view schematic diagram of a magnet array in accordance with one embodiment of the invention.

FIG. 6 shows a plan view of an array of magnets 60 positioned underneath the array 58 of mirror devices of FIG. 5. Two rows of the array of mirrors are shown for reference. Beneath each mirror device 48 is a magnet (or a portion of a magnet) 62 having a pole pointing in a direction parallel to the plane of the mirror and perpendicular to the column of mirrors under which the magnet lies. The magnets 62 underlying adjacent columns of mirrors have opposing polarity as indicated by the arrows, and are separated by magnets 64 having poles pointing in the direction perpendicular to the plane of the mirrors. The magnets 64 also alternate in polarity from one column to the next.

Figure 7A:
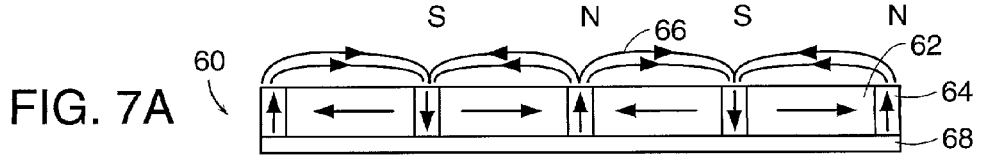
FIG. 7A is a cross-sectional schematic view of the magnet array of FIG. 6.

FIG. 7A shows a cross-section of the magnet array of FIG. 6. The array provides strong, highly uniform magnetic field 66 in the plane of the mirrors (which are not shown in FIG. 7A). The array desirably includes a soft magnetic field-enhancing material 68 underlying the magnets 62 and 64.

Figure 7B:
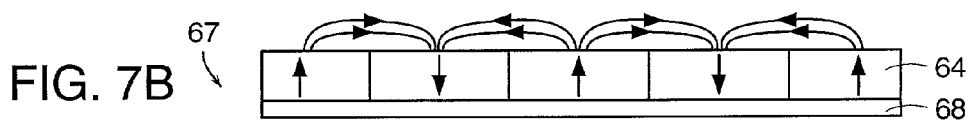
FIG. 7B is a cross-sectional schematic view of an alternate magnet array.
Figure 7C:
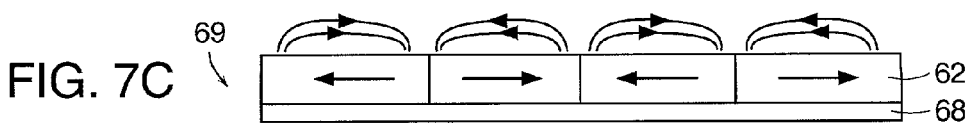
FIG. 7C is a cross-sectional schematic view of another alternate magnet array.

FIGS. 7B and 7C illustrate alternate magnet arrays 67, 69. In FIG. 7B, the magnet array 67 includes only magnets 64 having poles oriented in a direction perpendicular to the plane of the mirrors. In FIG. 7C, the magnet array 69 includes only magnets 64 having poles oriented in a direction parallel to the plane of the mirrors. Both magnet arrays provide magnetic fields in the plane of the mirrors.

Figure 8A:
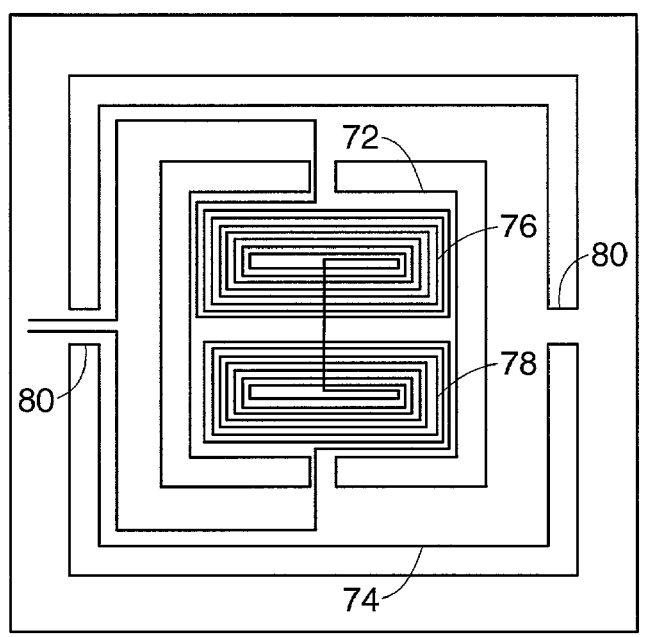
FIGS. 8A and 8B are plan view schematic diagrams of a mirror device in accordance with another embodiment of the invention showing X axis control coils and Y axis control coils, respectively.
Figure 8B:
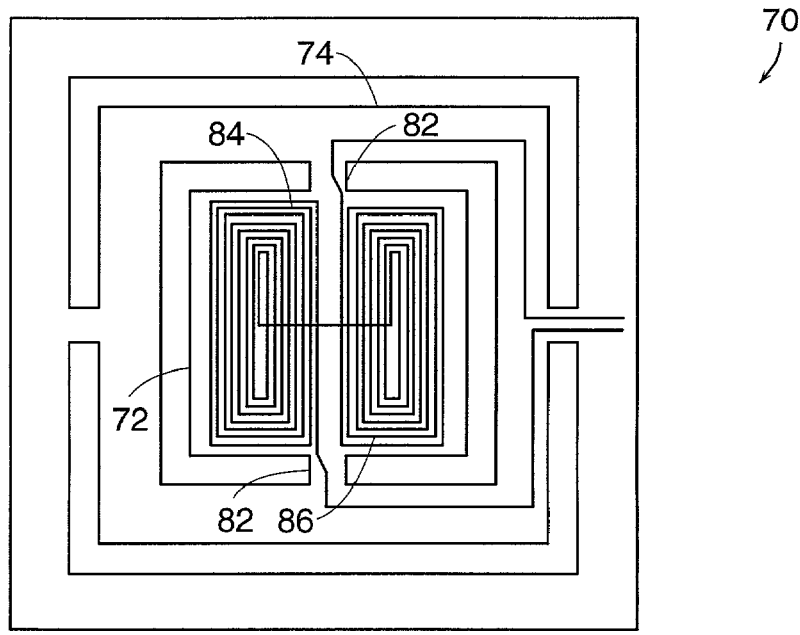

A mirror device 70 having an alternative and preferred coil configuration is illustrated in FIGS. 8A and 8B. The device 70 comprises a mirror 72 movably supported on a gimbal structure 74. Two pairs of control coils are provided on the mirror, each pair for controlling a different axis of rotation. The two pairs of coils are preferably plated on top of each other using two metal layers separated by a dielectric layer. For purposes of illustration, FIGS. 8A and 8B, each show only one of the two coil layers.

FIG. 8A shows the first coil layer having two coils 76, 78 that together substantially fill the mirror surface area arranged on a single circuit path. The coils 76, 78 are on opposing sides of the axis of the outer hinge pair 80 and are wound in opposite directions. In the presence of a magnetic field gradient extending out of the plane of the mirror, the coils 76 and 78 cooperate to provide a torque about the axis of the outer hinge pair 80 without generating any significant torque about the axis of the inner hinge pair 82. FIG. 8B shows the second coil layer, which is superimposed over the layer shown in FIG. 8A and has two coils 84, 86 that together substantially cover the mirror surface area and are arranged on a single circuit path. The coils 84, 86 are on opposite sides of the axis of the inner hinge pair 82 and are wound in opposing directions. In the presence of a magnetic field gradient extending out of the plane of the mirror, the coils 84 and 86 cooperate to provide a torque about the axis of the inner hinge pair 82 without generating any significant torque about the axis of the outer hinge pair 80.

Figure 9:
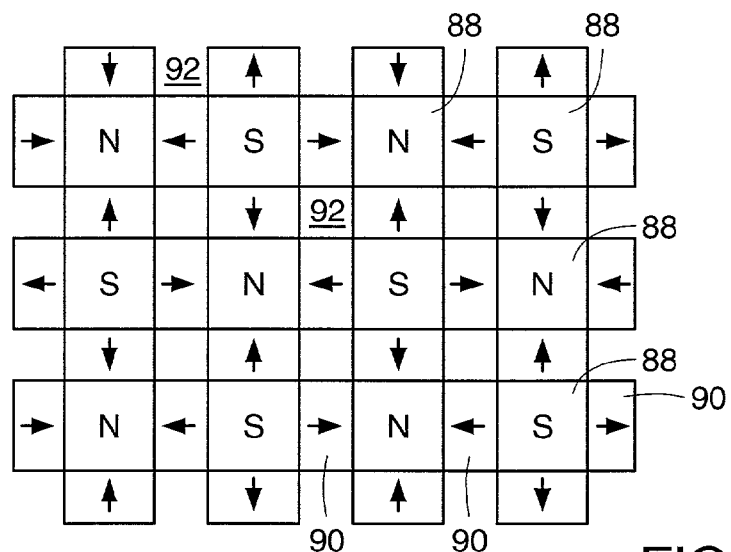
FIG. 9 is a schematic illustration of a magnet array in accordance with another embodiment of the invention.
Figure 10:
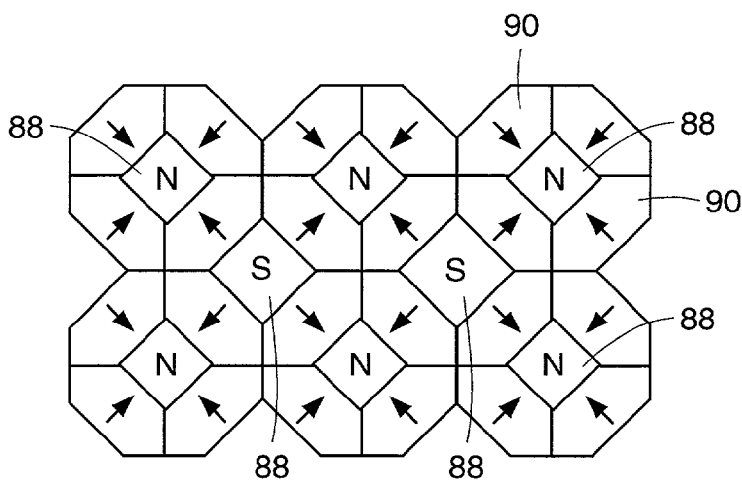
FIG. 10 is a schematic illustration of a magnet array in accordance with another embodiment of the invention.
Figure 11:
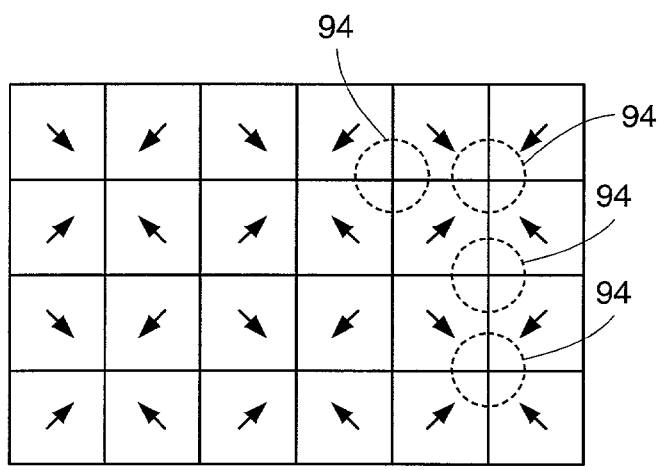
FIG. 11 is a schematic illustration of a magnet array in accordance with another embodiment of the invention.

FIGS. 9–11 illustrate examples of magnet arrays that can be used to supply a magnetic field gradient under each mirror of an array of mirror devices. In FIG. 9, an array of magnets 88 have poles perpendicular to the plane of an array of mirror devices. The magnets 89 are arranged underneath respective mirror device locations with alternating polarity. Magnets 90 with pole directions parallel to the mirror plane are positioned in both the row- and column-spaces between the magnets 88, with north poles all facing the magnets 88 whose north poles are facing up toward the plane of the mirrors. This arrangement provides a strong field extending upward (out or into the plane of the plane of the page) above each magnet 88. A soft magnetic material may also be positioned below the array as described above with respect the array of FIGS. 6 and 7. Spaces 92 may be left open or filled with a soft magnetic material as well.

FIG. 10 shows another magnet array arrangement similar to that of FIG. 9, but without the spaces 92. Mirror positions are over the magnets 88.

FIG. 11 shows yet another magnet array arrangement, related to that of FIG. 10 but utilizing only magnets with polarization in the direction of the plane of the mirrors. Mirror locations for this arrangement are indicated by the circles 94. This magnet array provides a simplified array in that a single shape and polarization may be used for each of the magnets, yet provides reasonably good performance.

Figure 12A:
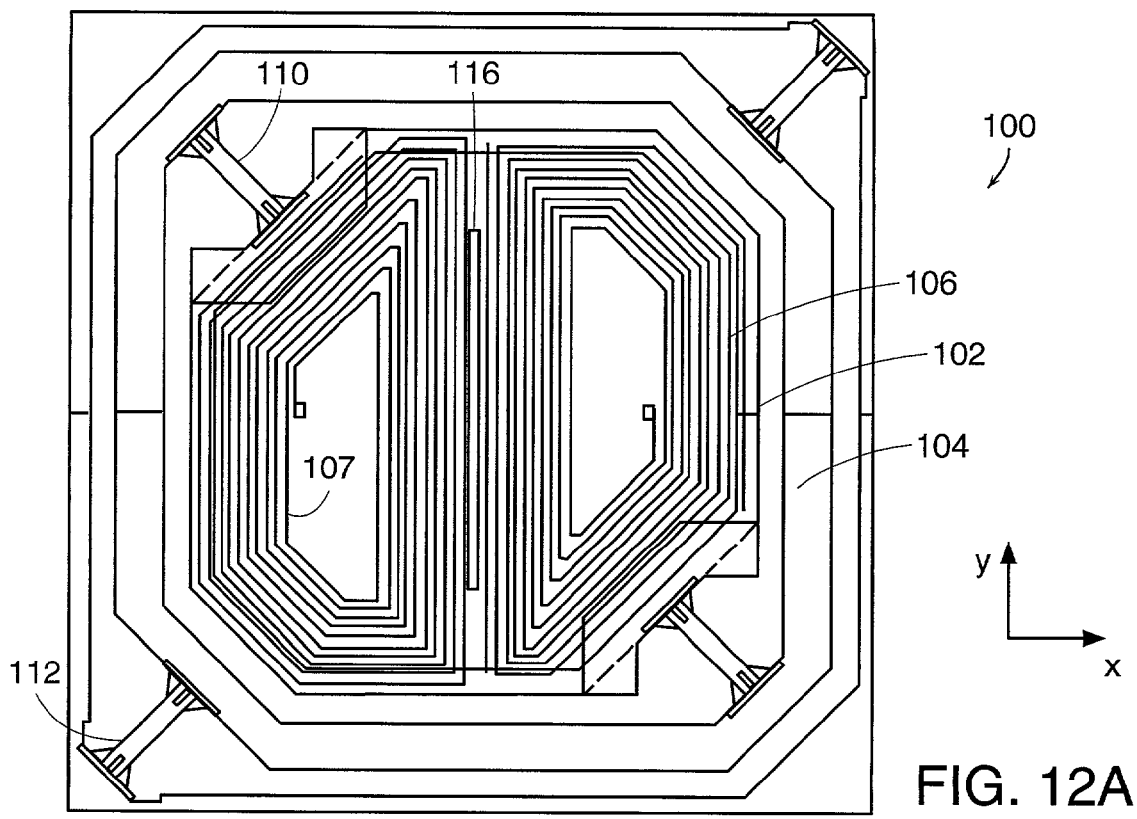
FIGS. 12A and 12B are plan view schematic diagrams of a mirror device in accordance with another embodiment of the invention showing X axis control coils and Y axis control coils, respectively.
Figure 12B:
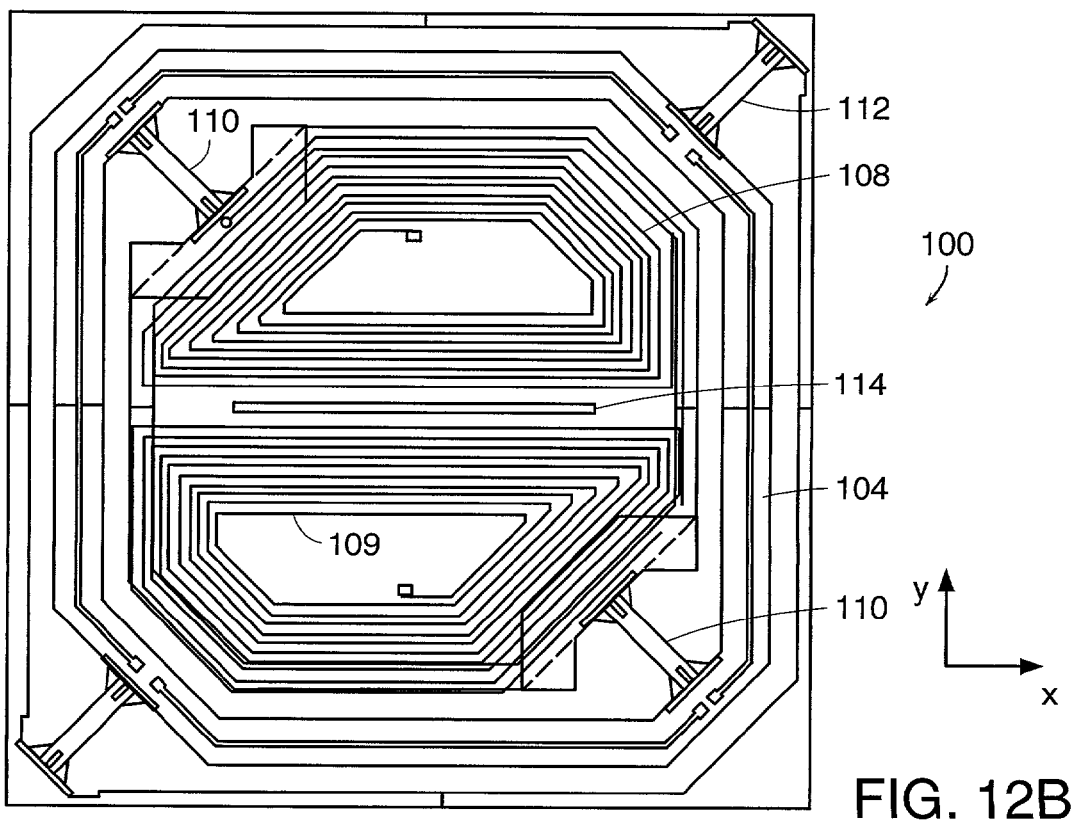

A mirror device or pixel 100 having an alternative coil arrangement is shown in FIGS. 12A and 12B. The device 100 comprises a mirror 102 supported on a gimbal structure 104 with inner and outer hinge pairs 110, 112. The device includes two pairs of control coils (106, 107 shown in FIG. 12A and 108, 109 shown in FIG. 12B) on the mirror, each pair for controlling a different axis of rotation. The two pairs of coils are preferably fabricated on top of each other using two metal layers separated by a dielectric layer. Each coil pair substantially fills the mirror surface area. For illustration purposes, FIGS. 12A and 12B, each show only one of the two coil layers. The reflective surface of the mirror is opposite to the surface shown.

The coils of each coil pair are wound in opposing directions. One pair of coils 106, 107 (FIG. 12A) rotates the mirror about a vertical or Y axis, the other pair of coils 108, 109 (FIG. 12B) rotates the mirror about a horizontal or X axis. Each pair of coils creates a quadrupole of magnetic field when current is applied. An array of external permanent magnets (shown e.g., in FIG. 13) provides a strong magnetic field gradient at the mirrors. When current is applied to either quadrupole, it creates a torque by interacting with the external magnetic field gradient. The coils 106, 107 act to provide torque about the Y axis without generating any significant torque about the X axis. Similarly, the coils 108, 109 act to provide torque about the X axis without generating any significant torque about the Y axis.

The two pairs of coils 106, 107 and 108, and 109 are formed substantially from two layers of metal separated by a dielectric layer. Crossovers 114 needed for the first coil pair 106, 107 are formed on the second metal layer (FIG. 12B), and likewise crossunders 116 for the second coil pair 108, 109 are formed on the first metal layer (FIG. 12A). Mirror devices that use pairs of coils that are coplanar rather than superimposed are far less efficient at applying torque than devices such as mirror device 100.

Figure 13:
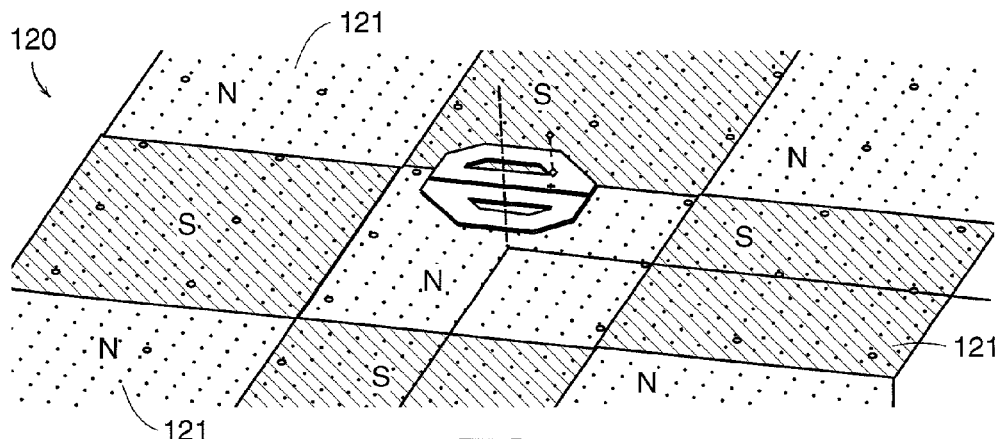
FIG. 13 is a schematic illustration of a magnet array in accordance with another embodiment of the invention.

An example of an array of magnets suitable for supplying a magnetic field gradient under an array of mirror devices 100 is shown in FIG. 13. As shown, a checkerboard array 120 of permanent magnets 121 magnetized in the Z direction has alternating N and S poles up. For reference, one representative coil pair of one mirror device is shown above the magnet array.

The preferred coil configurations described above, e.g., in FIGS. 12A, 12B, 8A and 8B provide increased torque per milli-ampere (mA) of current applied, allowing increased efficiency, faster motion and higher frequency response compared to prior art devices. In addition, the quadrupole arrangement provides two orthogonal axes of actuation. Accordingly, there is lower power consumption and reduced potential for cross-talk. Another advantage of the coil configurations is that there is no coil on the gimbal frame. The gimbal frame can accordingly be made narrower, providing greater space for the mirror. Higher fill factors such as, e.g., 65%, can accordingly be achieved.

In accordance with another alternative embodiment, more than two layers (e.g., three or four layers) of coils can be provided on each mirror in order to increase the number of coil turns to provide higher torque and thereby faster mirror motion or equivalent mirror motion at reduced drive current. In accordance with a yet another embodiment of the invention, the coils are positioned on the same side of the mirror as the reflective surface, with the reflective surface substantially covering the coils. An insulator can be provided between the coils and reflective surface. Alternatively, the reflective surface might itself comprise an insulator.

Other arrangements of magnets for providing magnetic field gradients and control coils are also possible. For example, in one alternative embodiment, magnets supplying a magnetic field gradient are positioned on the mirrors, and control coils (preferably similar to those shown in FIGS. 12A and 12B) providing orthogonal axes for actuation for each mirror are positioned external to the mirrors.

Mirror Array Packaging

Figure 14:
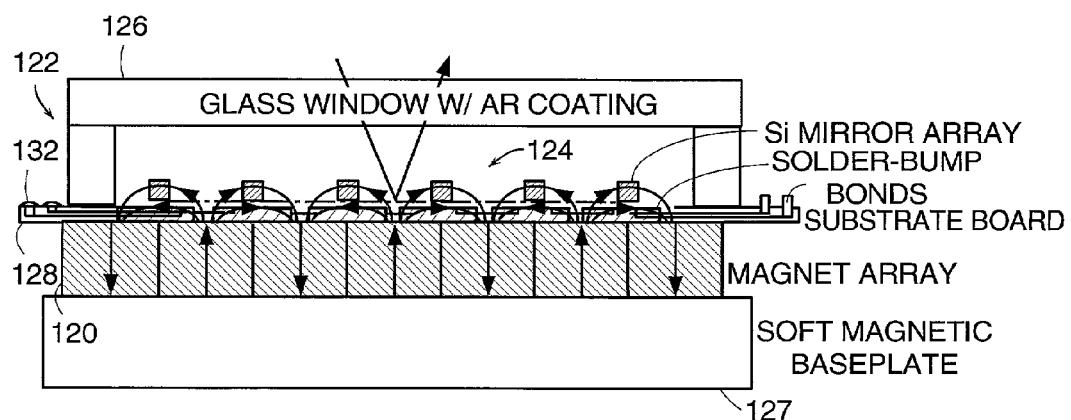
FIG. 14 is a cross-sectional schematic view of a mirror array package.
Figure 15:
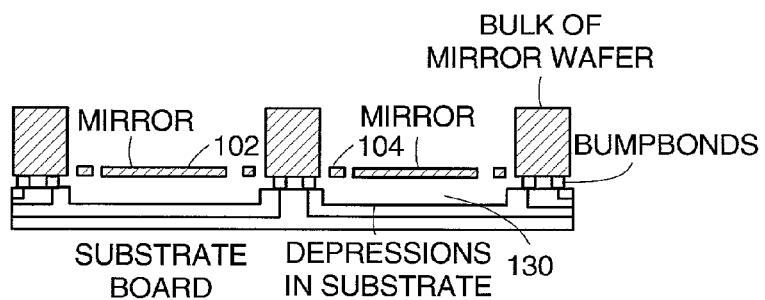
FIG. 15 is an enlarged view of a portion of FIG. 14.

FIG. 14 illustrates the packaging of an array of mirrors in accordance with another embodiment of the invention. The packaging allows high density lead transfer and protects the mirror array from the external environment. FIG. 15 is an enlarged view of a portion of FIG. 14. The mirror array is preferably packaged in a hermatic package 122 with the magnet array 120 on one side of the mirror array 124 and a window 126 on the other side. The magnet array is positioned on a soft magnetic baseplate 127, which acts as a return path for the magnetic flux.

The array of mirrors 124 is preferably bump-bonded to a substrate board 128 made of, e.g., ceramic, silicon, glass, or polymer, which performs the interconnect function. The substrate board 128 forms the bottom side of a package 122. The substrate board 128 may have depressions 130 aligned with the mirrors 102 to allow a preferably large angle of mirror deflection (which can be, e.g., 10 to 20 degrees) without the mirrors touching the board. The substrate board 128 brings electrical connections to edges of the board where wirebonds or bump bonds 132 or other connections can be used to connect to external circuitry. The bump bonds 132 or wirebonds can be formed on either surface of the substrate board 128 as desired.

The transparent window 126 (comprising, e.g., glass or plastic), which may be coated with an anti-reflection coating, forms the other side of the package 122. Optical beams can enter and exit through the window 126. Although not shown in FIG. 14, the window 126 is preferably sloped at an angle to inhibit multiple interference from any imperfect anti-reflection coating.

For illustrative purposes, the array shown in FIG. 14 has a row of five mirrors. An array in accordance with the invention can have a wide range of sizes such as, e.g., 16×16 or 36×36.

Feedback Mechanism

Figure 16A:
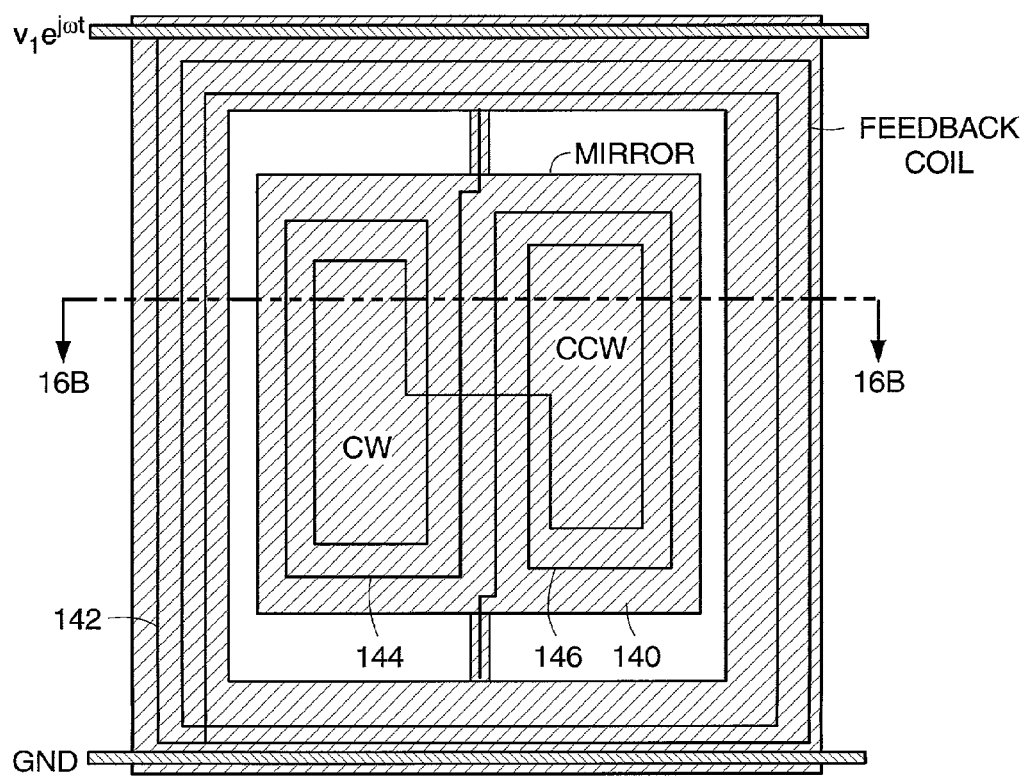
FIGS. 16A and 16B are plan and cross-sectional views, respectively, schematically illustrating an angle feedback detection mechanism in accordance with another embodiment of the invention.
Figure 16B:
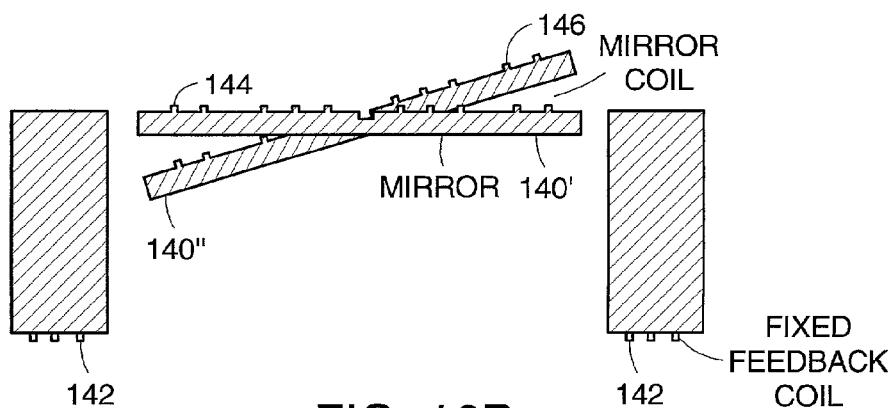

In accordance with a further embodiment of the invention, a mechanism is provided for monitoring and controlling the position of each mirror 140 in a mirror device using electromagnetic feedback. The mechanism provides closed loop control for accurate mirror steering. As shown in FIGS. 16A and 16B, a small magnetic coil 142 is positioned under each mirror 140 and driven with a high frequency current (typically 10 MHz to 1 GHz). If the mirror is not tilted (i.e., it is in the neutral position as indicated by 140'), then each half of a control coil pair 144, 146 on the mirror 140 will produce an equal and opposite output voltage resulting in zero output current in a detection circuit 148 described below with respect to FIG. 17. (For clarity, only one coil pair 144, 146 is shown on the mirror.) However, if the mirror is tilted (as indicated by 140"), the half of the coil pair 144, 146 that is closer to the drive coil 142 (in this case coil 144) will pick up a stronger signal than the half of the coil pair that is tilted away (i.e., coil 146), resulting in an unbalanced output signal, the strength of which is proportional to the angle of rotation in both sign and magnitude. Both axes of tilt (i.e., each coil pair on the mirror) can use the same excitation coil 142.

Figure 17:
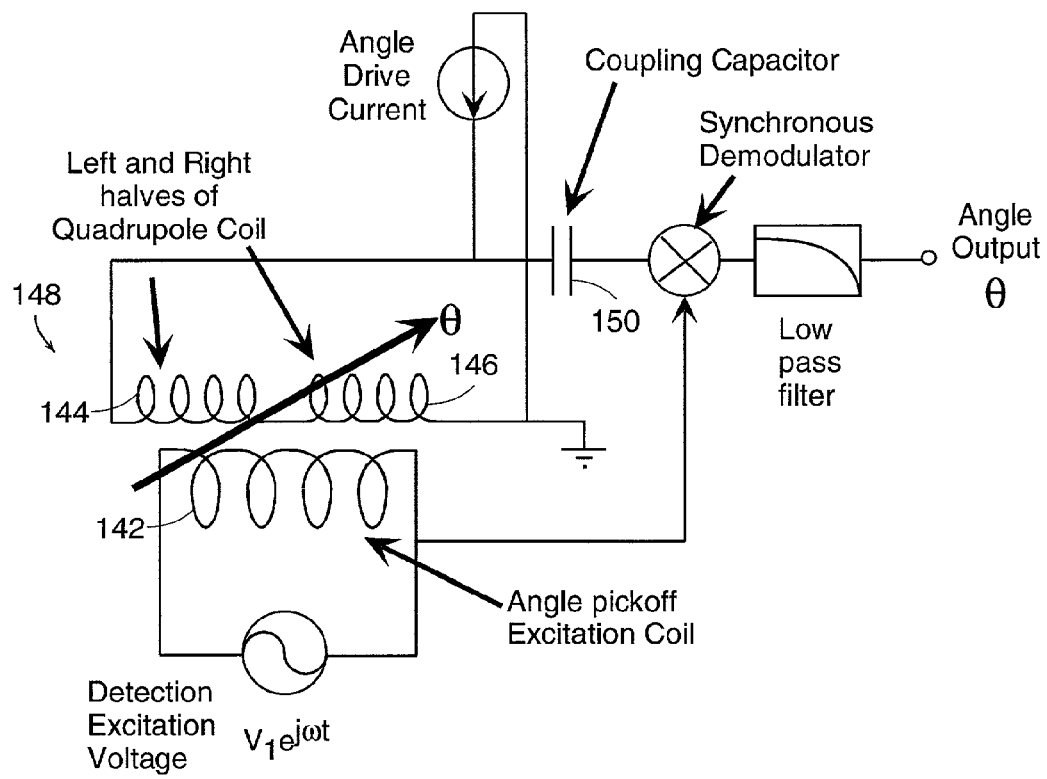
FIG. 17 is a schematic diagram illustrating an angle feedback detection circuit in accordance with the invention.

A circuit 148 for reading out the output feedback signal is shown in FIG. 17. (There is a separate circuit for each quadrupole.) The output signal is preferably read from the same coils 144, 146 and interconnects used to control the mirror position. Therefore, a reduced number of additional wires is needed to read out the position of each mirror. This is in contrast to other readout schemes (using additional capacitors or multiple photodiodes or piezoresistors), which require many additional wires per pixel. Synchronous detection is preferably used to extract the mirror position, using a chopper or multiplier synchronized to the drive coil signal. The drive coil signal may comprise a short sequence of pulses or sinusoidal cycles, such that the overall duty cycle of the drive signal is much less than one, thereby conserving power.

The position drive (i.e., mirror control) signals are generally at low frequency (<10 kHz) while the position pickoff (i.e., output) signals are at high frequency (>1 MHz). Accordingly, the two sets of signals are easily separated by filters and do not interfere with each other. They can be de-coupled with filters such as, e.g., the simple coupling capacitor 150 shown in FIG. 17.

Figure 19:
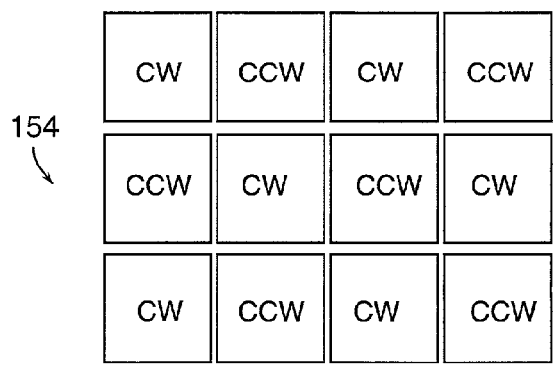
FIG. 19 is a schematic diagram illustrating the clockwise and counterclockwise pattern of the excitation coils shown in FIG. 18.
Figure 18:
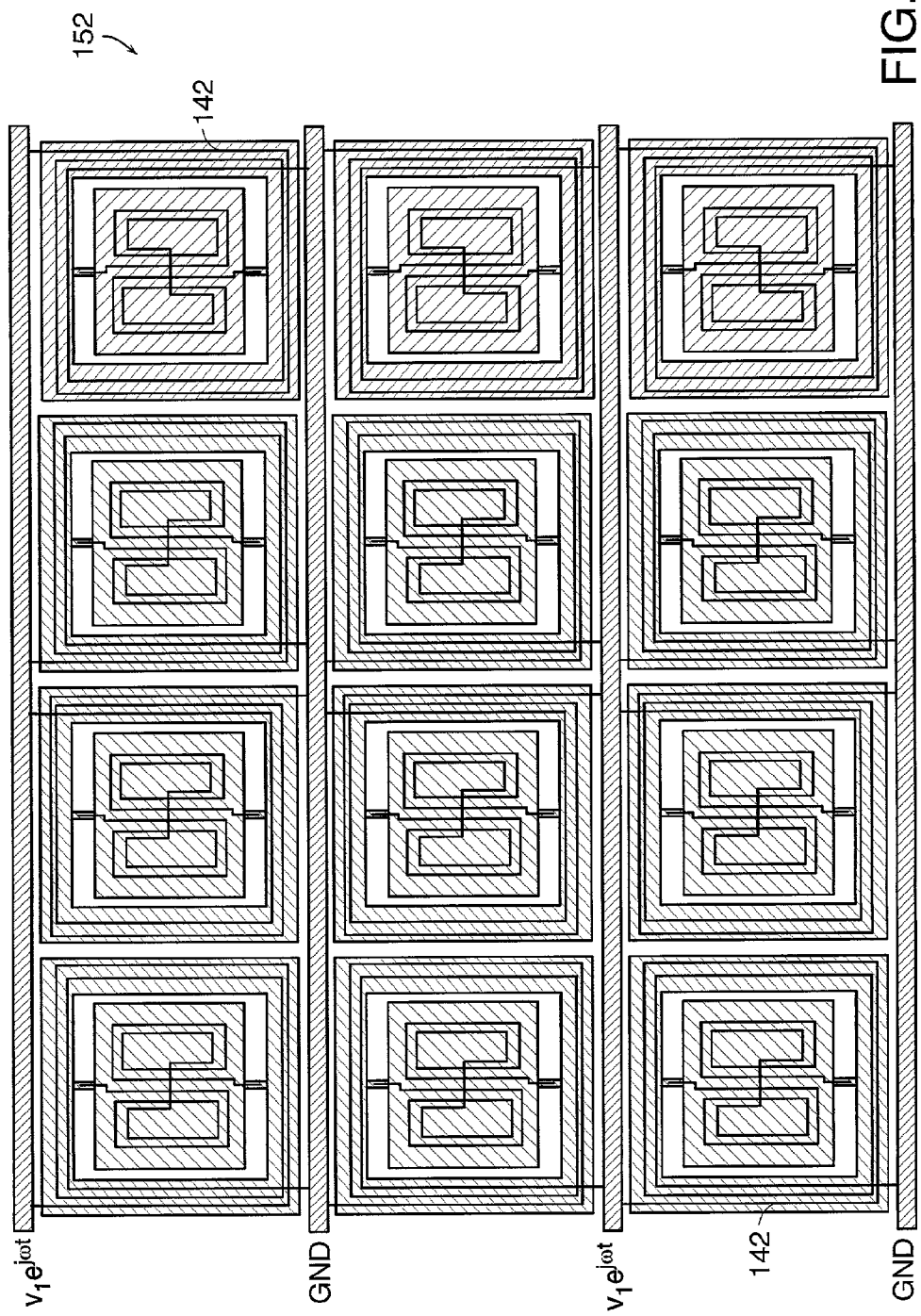
FIG. 18 is a plan view schematic diagram of an array of mirrors showing excitation coils used in providing angle feedback in accordance with the invention.

FIG. 18 shows an array of mirrors 152 showing excitation coils 142 under each mirror. Only one quadrupole is shown on each mirror for clarity. The excitation coils preferably alternate clockwise and counterclockwise in a checkerboard pattern 154 as shown in FIG. 19.

The magnetically actuated devices described above have a number of possible commercial applications including, e.g., use in optical switches (including, e.g., but not limited to 3D optical switches) for telecommunications, scanners, laser beam steerers, LADAR (LAser Detection and Ranging) imagers, wearable displays, and optical image projectors.

Device Fabrication

A further embodiment of the invention is directed to manufacturing techniques for fabricating or microfabricating optical mirrors or mirror arrays.

The process described below is in the context of manufacturing a basic mirror device or pixel 160 shown in FIG. 20 or an array of such mirror devices. However, this is for illustrative purposes only, and it should be understood that the general process in accordance with this embodiment of the invention can be used for manufacturing a variety of mirror pixel and array designs, including, e.g., the mirror pixels and arrays shown in FIGS. 8 and 12.

Figure 20:
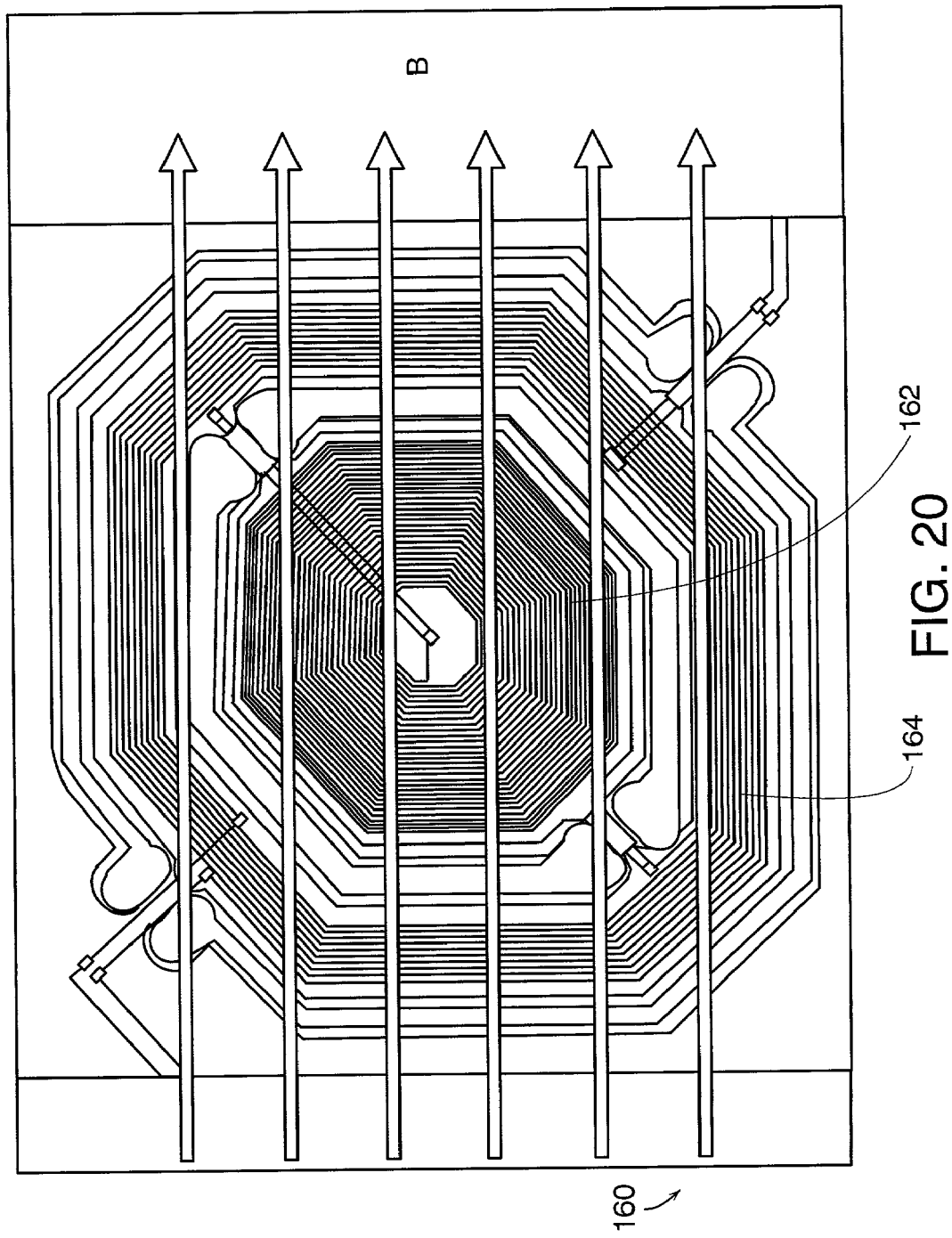
FIG. 20 is a plan view schematic diagram of another mirror device.

FIG. 20 shows a schematic of the magnetic flux in relation to a single basic mirror pixel 160 in an array. The basic device has two coils, one on the mirror member 162 and one on the gimbal frame 164. The device operates through the application of a current to one or both of the coils. The outer coil is on the gimbals and causes a rotation of both the gimbal and the mirror about the outer flexures of the gimbal mechanism. The inner coil is on the backside of the mirror, and causes a rotation about both sets of flexures. This leads to a cross coupling of the axes, but can be controlled with an electronic control system or compensated for in the currents applied to the two coils. Other pixel designs can be used which eliminate the cross coupling. As previously mentioned, the basic fabrication techniques described herein are applicable to many designs of mirror pixels and arrays.

The preferred fabrication method has several advantages over the prior art. The mirror is located on the backside, bottom, or buried side of the device layer of a silicon-on-insulator (SOI) wafer. This surface is extremely flat due to the fabrication process of making the SOI wafer. Accordingly, no additional mirror polishing steps are required in the mirror fabrication process in accordance with the preferred embodiment. Because of the device design and fabrication process, the mirror surface remains generally protected for the majority of processing. This protection allows for a mirror surface that is not as rough as a mirror surface that is exposed to other processing, or one made of a material such as polysilicon. The mirror surface also does not require additional planarization or polishing as would a polysilicon mirror surface, which reduces the number of fabrication steps and therefore cost of the final product. It should be noted, however, that a fabrication process in accordance with the invention could use polysilicon and any needed polishing to achieve an SOI type wafer, and this type of embodiment is not excluded from the scope of this invention. Multiple coil layers are preferably used on the mirror, which allows for an increase in the number of turns on the mirror. This allows the mirror size to be reduced if desired, or the drive current (or power) required in a constant magnetic field to be reduced. Use of deep reactive ion etching (DRIE) allows the dimensions of the mirror to be kept small, as lateral undercutting is minimized. Through the use of this design and fabrication process, the device may achieve large deflection angles compared to other approaches such as electro-statically actuated mirrors. Another advantage is that the drive electronics of an electromagnetically actuated mirror do not require high voltages, and as such may be more standard in terms of the voltage levels required. The use of standard electronics voltages could reduce the cost of the total system, as the cost of the drive electronics would be lower compared to a high voltage electrostatic mirror alternative.

A general overview of an example fabrication flow in accordance with the preferred embodiment is set forth below. It should be understood that the inventive process is not limited to the specific steps described.

Figure 21:
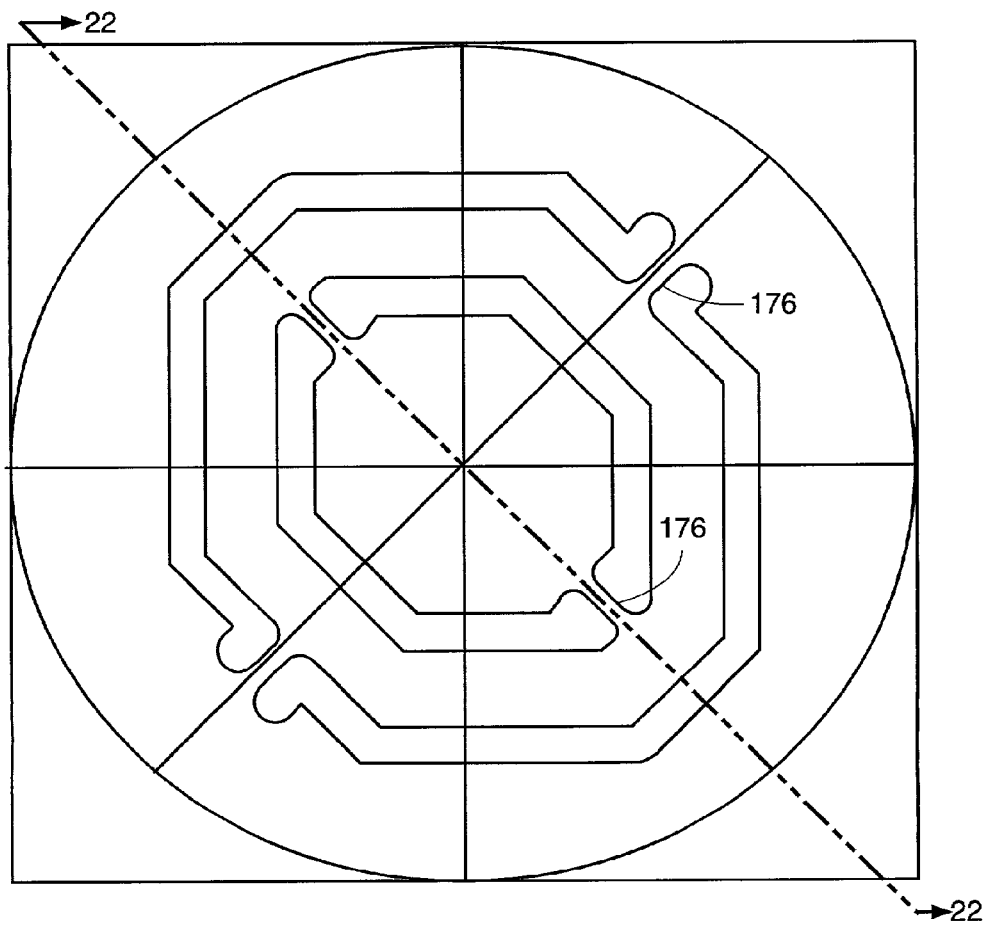
FIG. 21 is a plan view schematic diagram of a structure being fabricated into the FIG. 20 mirror device, showing a nitride etch step.
Figure 22:
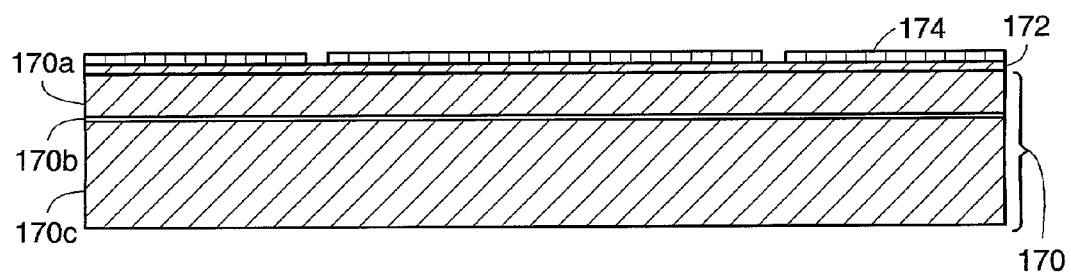
FIG. 22 is a cross-sectional view taken along line 22—22 of FIG. 21.

1. Start with a bare SOI wafer
2. Deposit or grow oxide layer
3. Deposit low stress nitride layer or high stress stochiometric nitride
4. Etch pattern in nitride
5. Deposit metal 1
6. Deposit insulator 1 (e.g., polyimide)
7. Open vias in insulator 1
8. Deposit metal 2
9. Deposit insulator 2 (e.g., polyimide)
10. Open vias in insulator 2
11. Pattern for front silicon etch
12. Etch oxide
13. Etch in ICP or DRIE
14. Pattern for back silicon etch
15. Etch backside nitride
16. Etch backside oxide
17. Mount on carrier wafer
18. Etch backside silicon in ICP or DRIE
19. Remove carrier wafer
20. Undercut flexures with Xenon Difluoride or other Si etch
21. Remove buried oxide from mirror surface
22. Evaporate mirror metal on backside, e.g., Ti/Au The fabrication process begins with a silicon on insulator (SOI) substrate 170 with a device layer thickness generally equivalent to the desired thickness of the mirror mass. The substrate 170 comprises a device region 170a of silicon having a thickness of about 50 microns, an oxide layer 170b having a thickness of about 1 micron, and an underlying layer of silicon 170c having a thickness of about 400 microns. The wafer is then oxidized with either a thermal oxide or a low temperature oxide to form a silicon dioxide layer 172. A nitride layer 174 is then deposited on top of the oxide layer. The oxide layer serves as the etch stop layer and protection layer for the nitride layer. The nitride layer is then patterned to form the gimbal flexures 176. (Materials other than nitride can also be used such as, e.g., polysilicon encapsulated in silicon dioxide.) In the preferred embodiment of the invention, the region that forms the mirror has nitride etched from the center to reduce the effects of the residual stress on the mirrors, which if not performed, would tend to cause the mirrors to bend or curl out of the mirror plane. FIGS. 21 and 22 show top and side cross-section views, respectively, of this example. (Note the nitride is not removed from the center of this mirror as shown in the figures, as in the case of the preferred embodiment).

Figure 23:
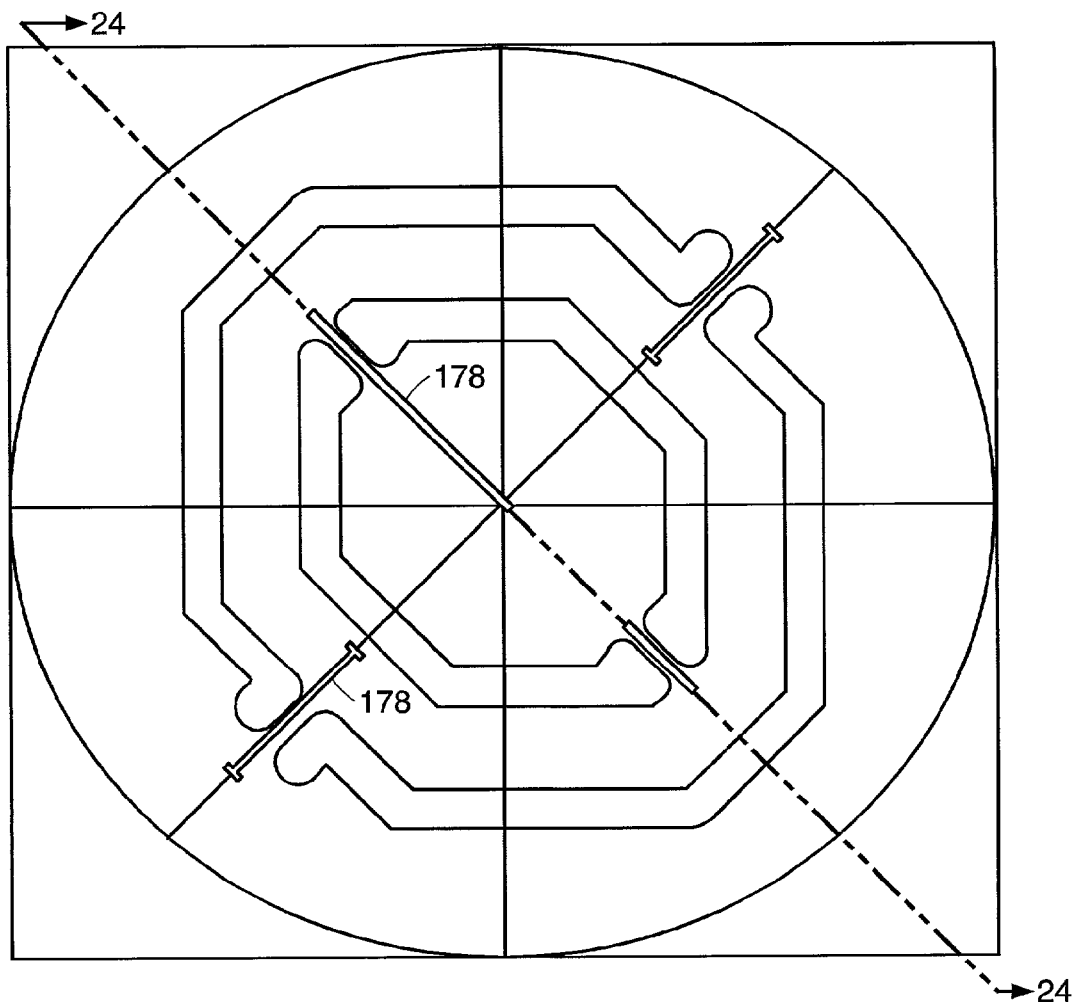
FIG. 23 is a plan view schematic diagram of the structure showing a first metalization step.
Figure 24:
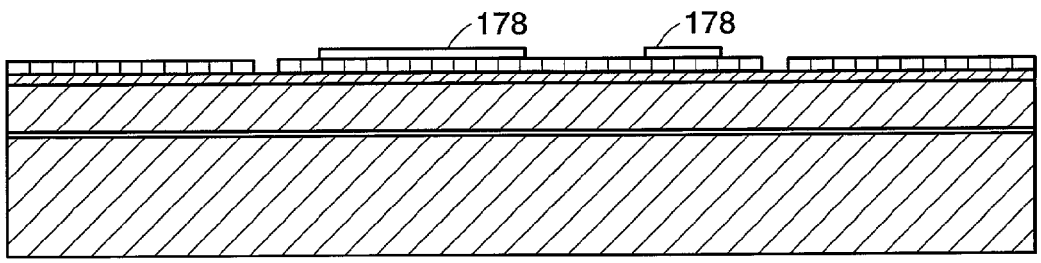
FIG. 24 is a cross-sectional view taken along line 24—24 of FIG. 23.

The first metal layer (metal 1) 178 is then deposited through electro-deposition techniques. This process involves depositing a seed layer on the wafer and then patterning it with photoresist, which serves as a plating mold. The pattern is then electroplated with an electrically conductive metal, e.g., gold. The photoresist is then removed, either with a wet photoresist stripper, organic solvent, plasma, or other dry etching technique. The seed layer may then be etched with either a wet chemical etch, or by a dry process such as ion beam milling. FIGS. 23 and 24 show top and side cross-section views, respectively, of the top and sides after the seed layer and plating mold have been removed. Placing a coil on metal 1 would increase the rotation per milli-ampere of the device. The metal deposition could also be performed with a lift-off metalization process, or by sputtering or evaporating a thick metal and removing it by a wet chemical etch or ion beam milling.

In accordance with another embodiment of the invention, an additional layer of polyimide (not shown in drawings) is deposited between the nitride layer 174 and the first metal layer 178. This polyimide layer serves as a mechanical buffer layer to separate stress in the coil layer from the silicon mirror.

Figure 25:
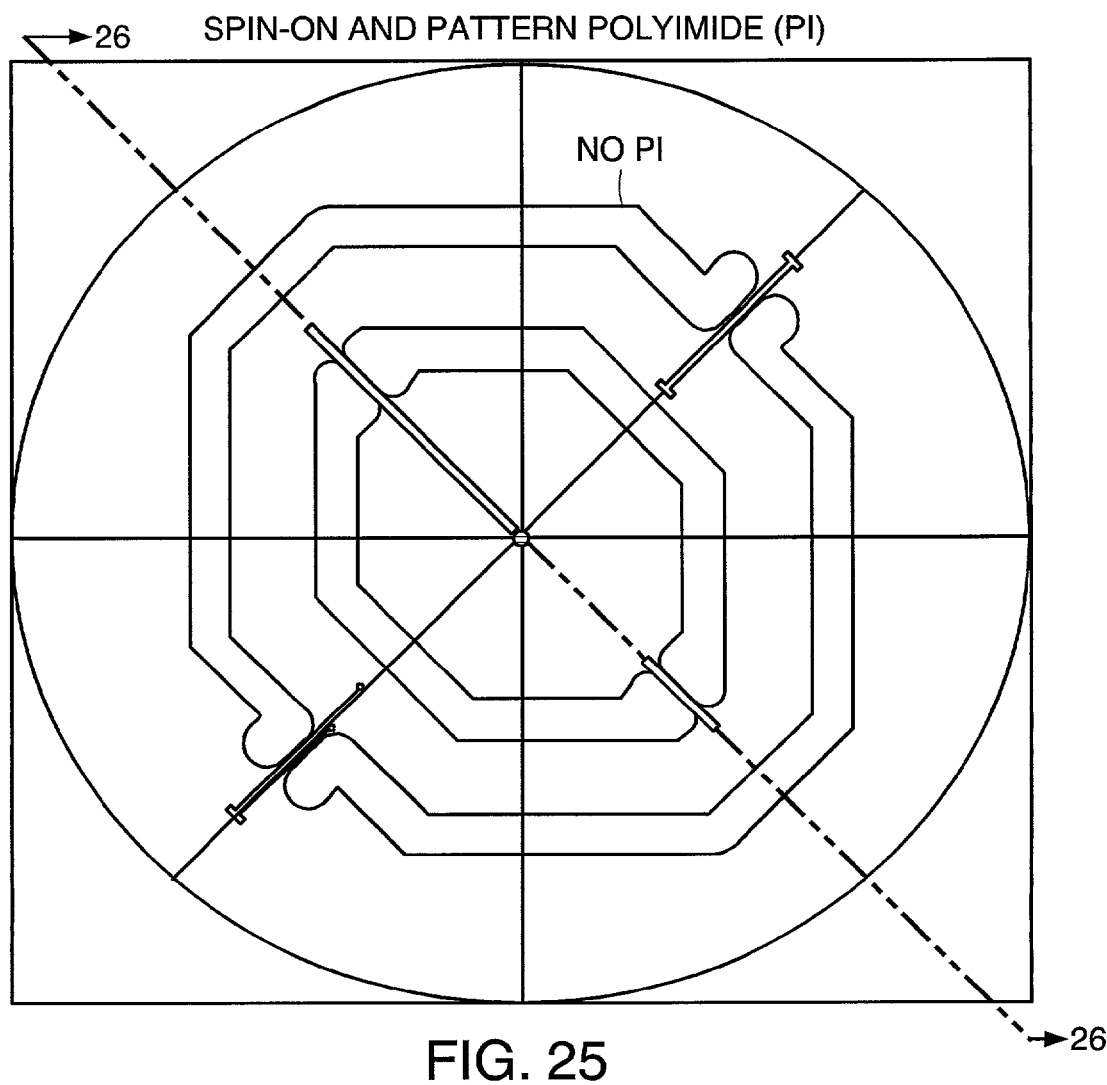
FIG. 25 is a plan view schematic diagram of the structure illustrating a polyimide etch step.
Figure 26:
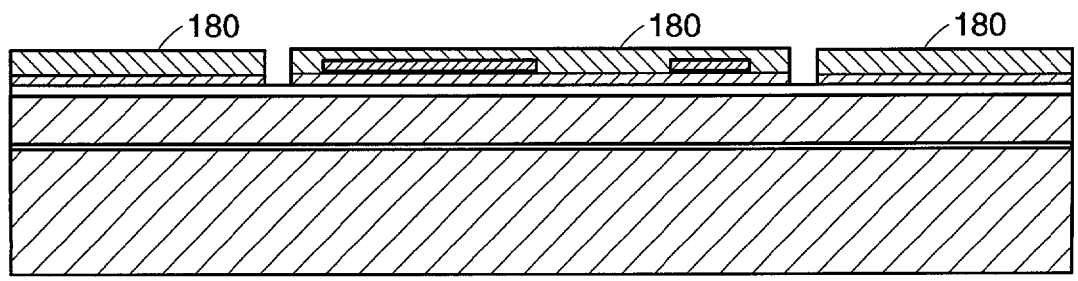
FIG. 26 is a cross-sectional view taken along line 26—26 of FIG. 25.

A layer of polyimide 180 or other insulating material is then spin deposited on the wafer to provide dielectric isolation of the metal 1 layer to the second metal layer. It would also be possible (and the inventive process could include but is not limited to) for a dielectric to be deposited by plasma enhanced chemical vapor deposition (PECVD), sputtering, or other techniques. FIGS. 25 and 26 show top and side cross-section views, respectively, of the polyimide etch step. The polyimide may be patterned by one of several techniques. The polyimide may be fully cured and then a metal hard mask such as aluminum deposited and patterned and etched. The wafer is then placed in a plasma etcher, such as a reactive ion etcher (RIE), and the polyimide is removed where the holes in aluminum exist. The aluminum is then stripped from the wafer. The hard mask step may be skipped and photoresist may be used to mask the polyimide during the plasma etching. Another technique is to wet etch the polyimide by patterning the polyimide after soft baking (as opposed to fully cured material) with photoresist. When the resist is developed in a developer such as a potassium hydroxide based solution, the polyimide will also be removed from the region.

Figure 27:
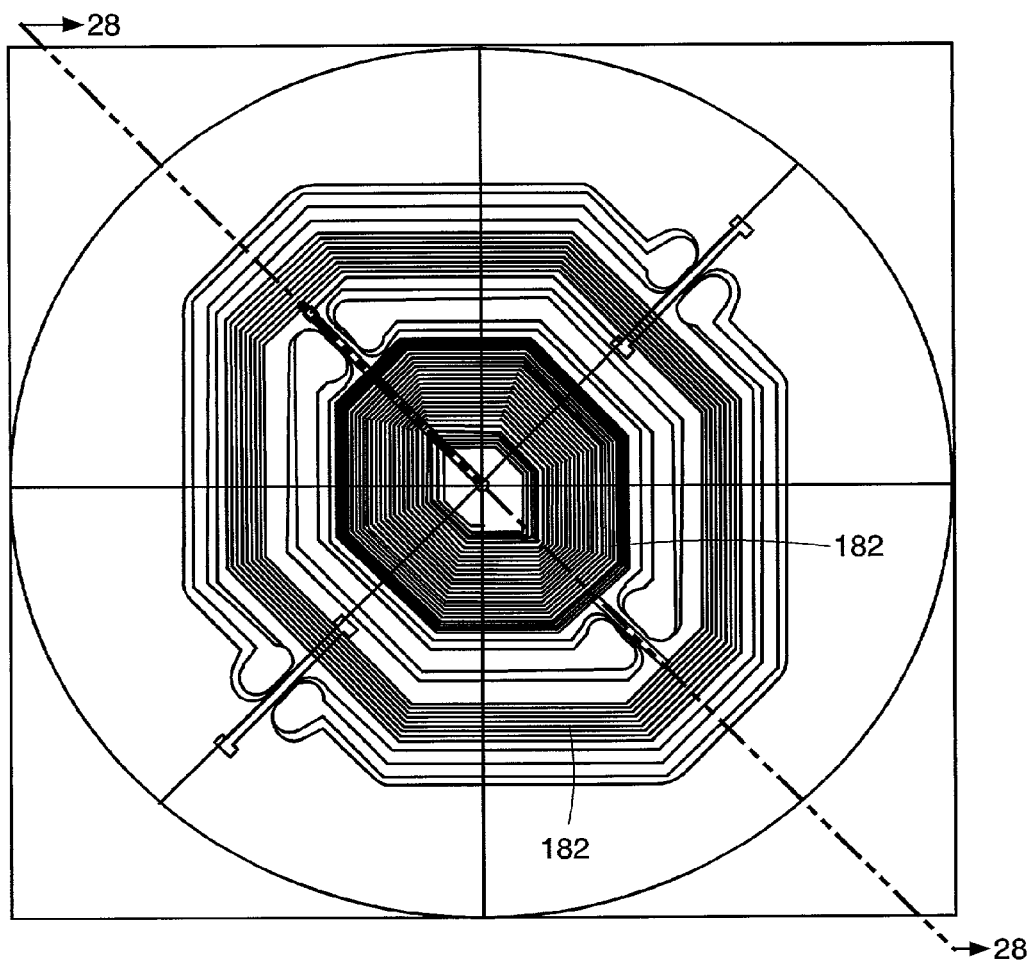
FIG. 27 is a plan view schematic diagram of the structure showing a second metal deposition.
Figure 28:
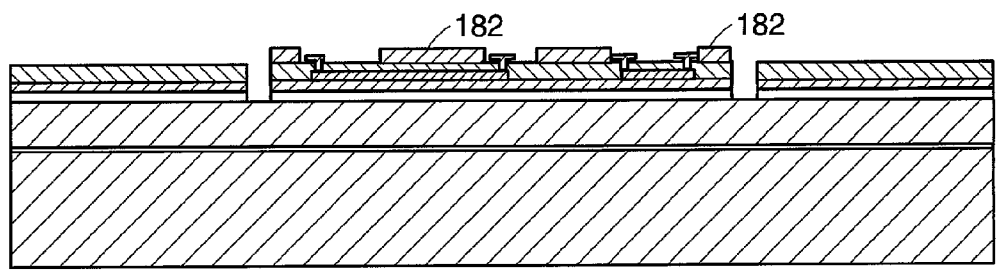
FIG. 28 is a cross-sectional view taken along line 28—28 of FIG. 27.

The second metal layer 182 is then patterned on the wafer. This process is generally the same as the process used for the metal 1 layer. It should be noted that the materials plated, sputtered, or evaporated may be different than those used in the metal 1 layer. FIGS. 27 and 28 show top and side cross-section views, respectively, of the pixel after deposition of the metal 2 layer.

Figure 29:
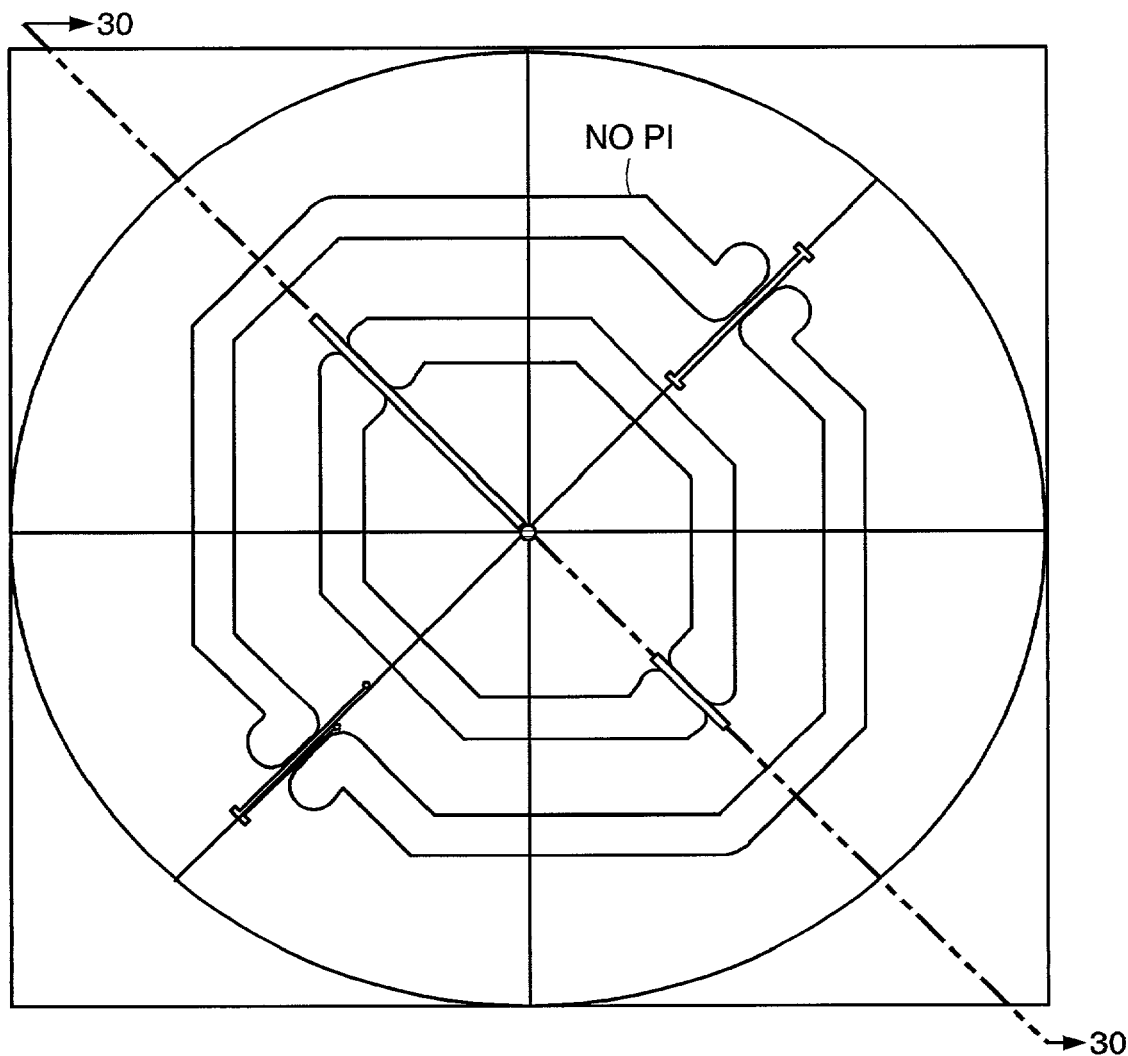
FIG. 29 is a plan view schematic diagram of the structure after a second polyimide etch step.
Figure 30:
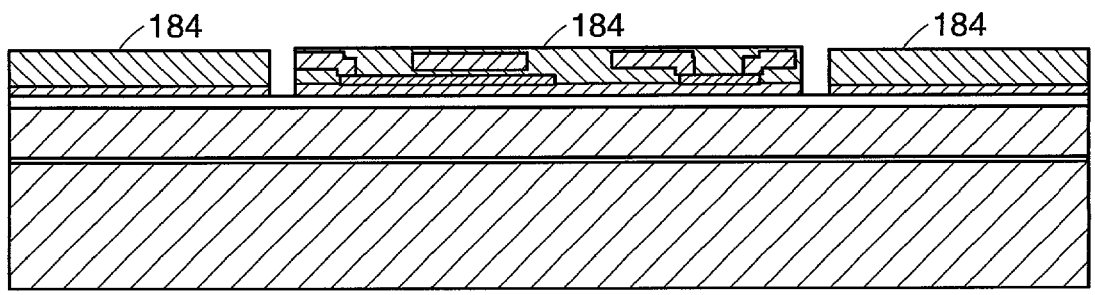
FIG. 30 is a cross-sectional view taken along line 30—30 of FIG. 29.

A second layer of polyimide 184 is deposited over the wafer and then patterned in a manner similar to the first polyimide etch step. FIGS. 29 and 30 show top and side cross-section views, respectively, of the pixel after the second polyimide patterning is complete. In the design of the device, it may be desirable to remove all of the polyimide or other dielectric material from the flexures to reduce stiffness and other problems such as, but not limited to creep and fatigue. This is not shown in the drawings, but could be achieved in the same process sequence by changing the pattern on the mask.

Figure 31:
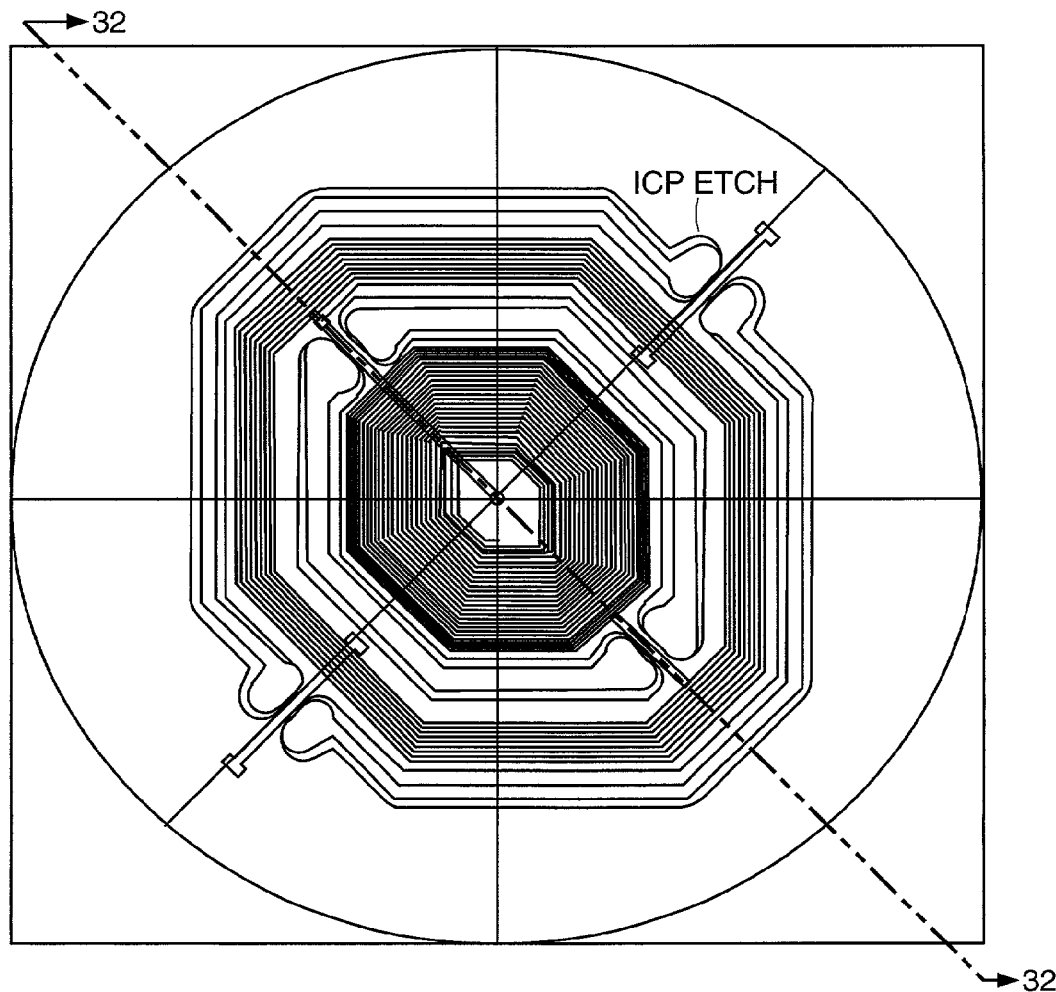
FIG. 31 is a plan view schematic diagram of the structure after a front side ICP (Inductively Coupled Plasma) etch step.
Figure 32:
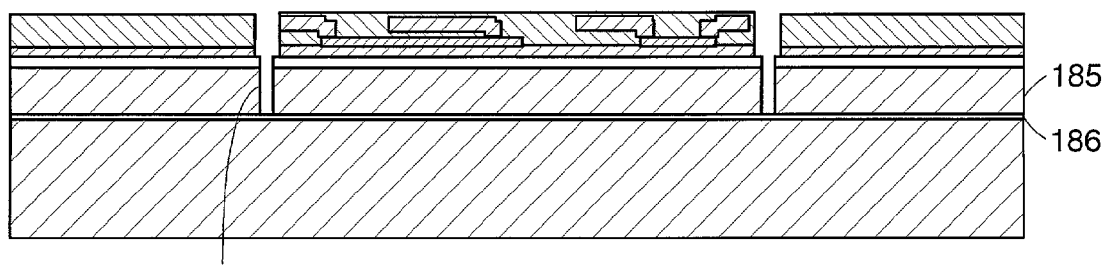
FIG. 32 is a cross-sectional view taken along line 32—32 of FIG. 31.

The next step in the process is to etch the device layer silicon 185 to the buried oxide layer 186 in regions that will become open space to allow motion of the mirror and gimbals as indicated at 188. In accordance with the preferred embodiment of the invention, a deep RIE or inductively coupled plasma etch is used to achieve this. FIGS. 31 and 32 show top and side cross-section views, respectively, of the device after the front silicon etch is complete. This silicon etch can also be performed with wet anisotropic or isotropic silicon etchants. The advantage of a deep RIE etch is that the aspect ratios may be large and the amount of pixel space that has to be reserved for undercutting during etching is much smaller than it would be for an isotropic etch.

Figure 33:
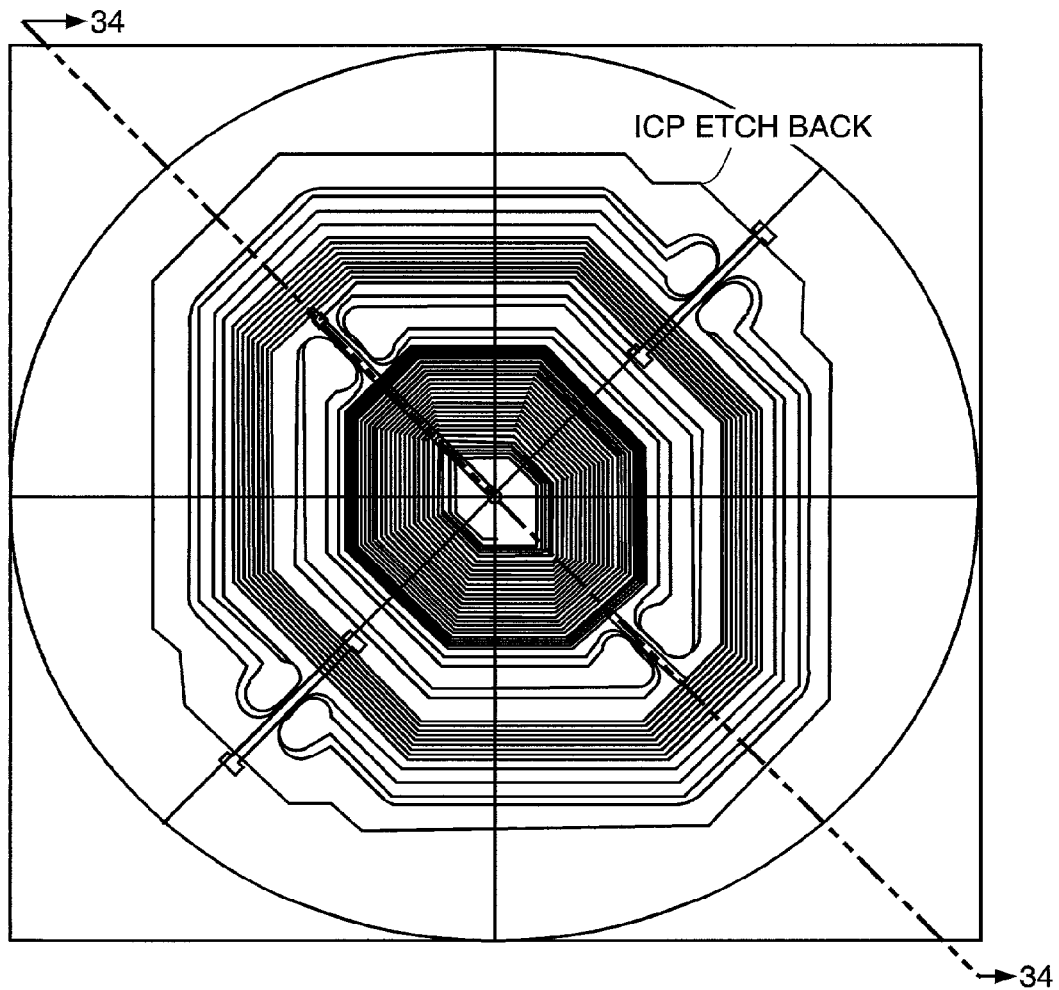
FIG. 33 is a plan view schematic diagram of the structure after an ICP back etch step.
Figure 34:
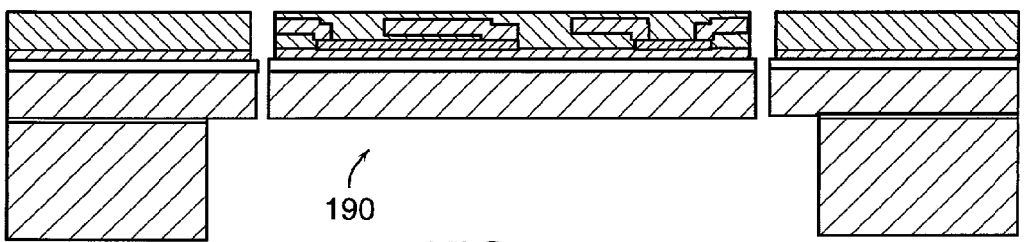
FIG. 34 is a cross-sectional view taken along line 34—34 of FIG. 33.

The device wafer is then backside patterned for the backside ICP etch as indicated at 190. After completion of this photolithography step, the device wafer is mounted on a carrier wafer for backside ICP etching. The carrier wafer is used to reduce loss during handling in the ICP machine. The use of the carrier wafer is not required by the process. FIGS. 33 and 34 show top and side cross-section views, respectively, after the ICP back etch is complete. If a carrier wafer is used in the process, it is removed after the ICP front etch by solvent release, although this could vary depending on the actual material used to adhere the device and carrier wafers together.

At this stage there remains silicon under the flexure material, which in this description is silicon nitride. The silicon is preferably removed to allow for less flexural rigidity. The device could still operate with this silicon present, although the increased stiffness would require a larger current to reach the desired angle of rotation. The preferred method of removing the silicon under the flexures is a xenon difluoride etch. This is a dry etch that is isotropic and highly selective to silicon. If a low stress silicon nitride material is used as the flexure material and the polyimide has been removed to reduce flexural stiffness, the flexures may be made up of a sandwich of stochiometric nitride, low stress nitride and stochiometric nitride. The low stress nitride is silicon rich and may be attacked by the xenon difluoride. Stochiometric nitride withstands this etch better than the silicon rich nitride. Details of the nitride thickness and composition should be considered in making the final choice of the flexure materials.

Figure 35:
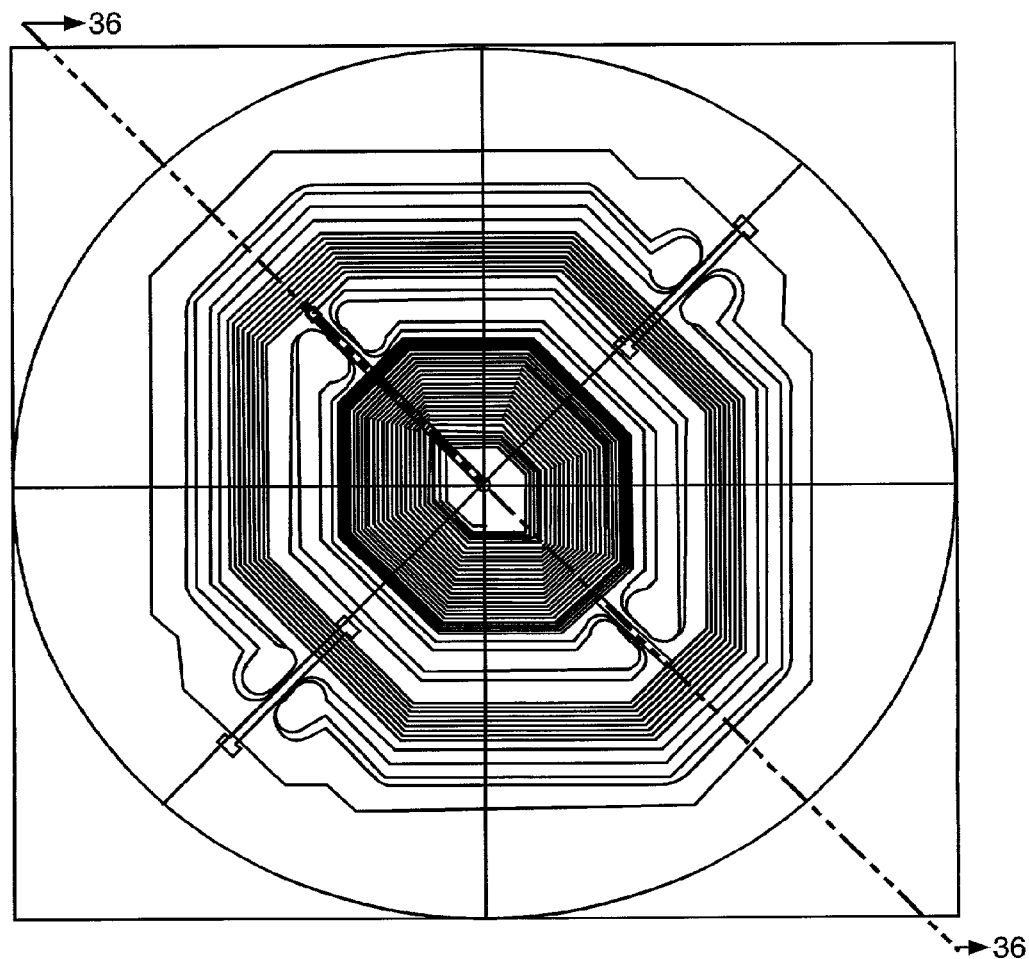
FIG. 35 is a plan view schematic diagram of a completed mirror device.
Figure 36:
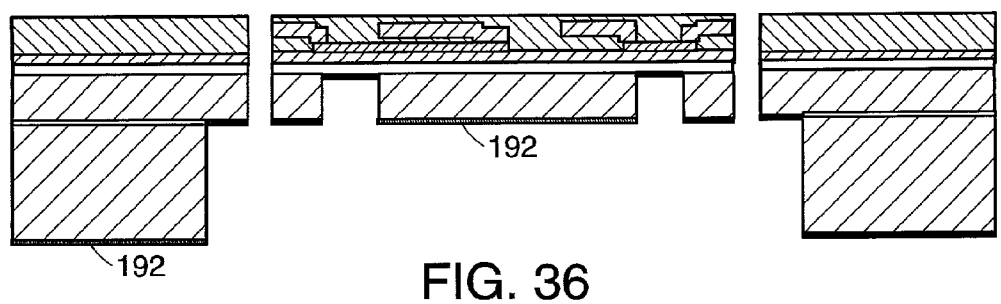
FIG. 36 is a cross-sectional view taken along line 36—36 of FIG. 35.

The final step in the process is to deposit a layer 192 of titanium and gold or other metal or reflective surfaces on the mirror surface, or the backside of the device wafer. The metal is not patterned, although this may be performed through the use of a shadow mask if desired. FIGS. 35 and 36 show top and side cross-section views, respectively, of the completed pixel.

One variation to the process flow described above would be the addition of a third metal layer that only crosses the flexures. This may or may not include an additional polyimide layer, depending on the exact layout of the device. The advantage of adding an additional metal layer would be to have a metal or electrically conductive member with improved mechanical properties, but possibly slightly higher electrical resistivity. Due to the higher resistivity, if the metal 1 layer consisted of this material on the third metal layer, the power dissipated on the mirror would be increased, but not add any more torque. This third additional metal layer could be deposited at several points during the process, and this disclosure does not limit the use of the "third metal layer" to the layer deposited third.

It would be apparent to one skilled in the art that variations of this process are possible. The scope of this invention is intended to cover these variations in the process sequence, material selection, exact deposition process, and other changes.

Device Assembly

A further embodiment of the invention relates to the assembly or packaging of mirror array devices. One objective is to assemble an array of permanent magnets and accurately position the array of magnets behind an array of mirrors for optimal performance of the mirror array. Prior art electromagnetic micro-machined mirrors use magnets mounted on the ends of the package to generate a magnetic field across the device. This approach is generally acceptable when there are few mirrors, but not when there is a large array of mirrors. Having a large array of mirrors requires the magnets to be spaced farther apart. The increased distance between magnets leads to a decrease in the magnetic field obtained for the mirrors. The embodiment of the invention described herein overcomes the problems of the prior art by placing the magnets close to the mirror array by positioning them behind the mirror array, which allows for larger magnetic fields to be generated at the mirrors.

The magnet positioning is also preferably adjustable, which reduces the number of precision parts required in the package. This reduction in precision parts results in a lower cost of the final package. Another advantage of the adjustable magnet positioning is that the magnets may be repositioned after final assembly, which will improve the final yield and therefore reduce the cost of manufacture of a large number of devices.

Figure 37:
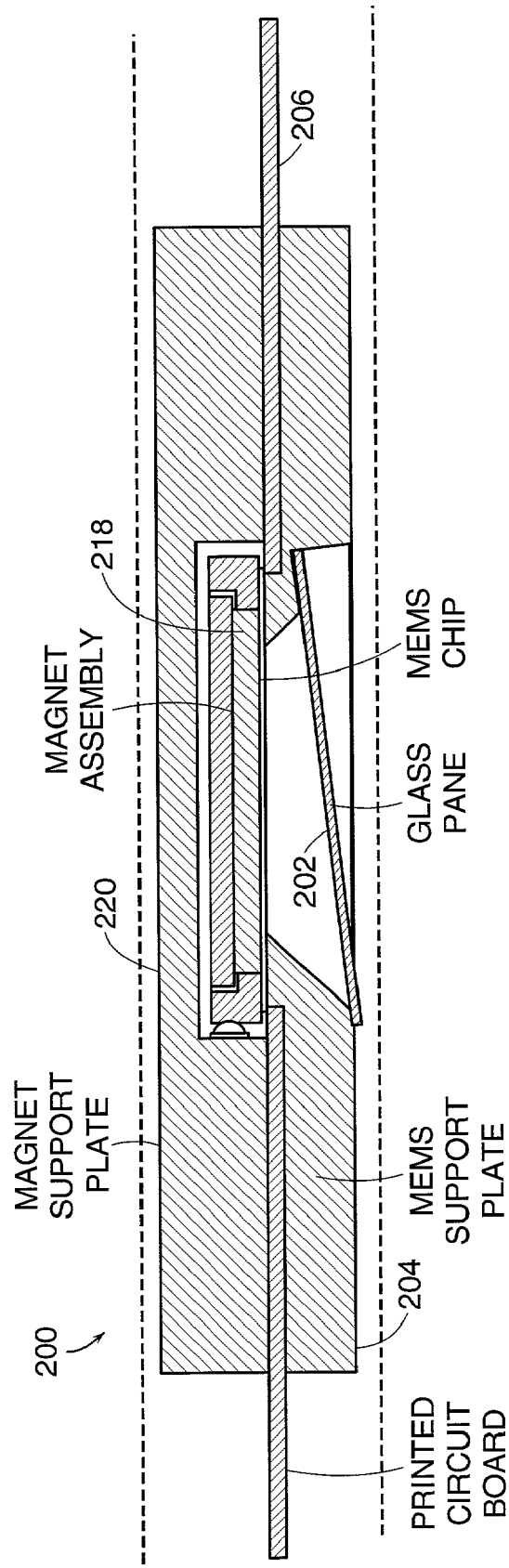
FIG. 37 is a cross-sectional view of a mirror array package in accordance with another embodiment of the invention.
Figure 38:
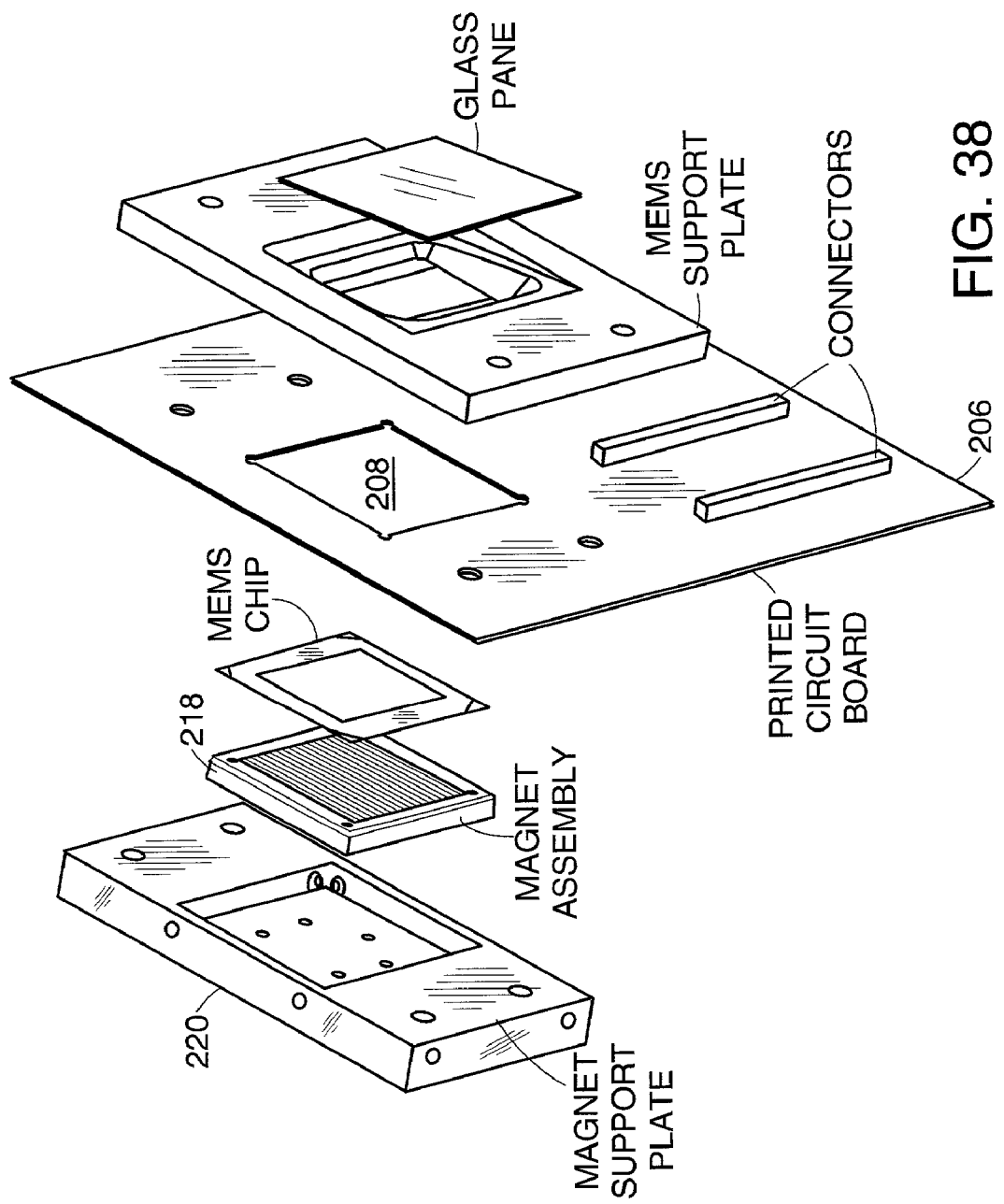
FIG. 38 is an exploded view of the mirror array package.

FIG. 37 shows a side cross-section view of a package 200 for a mirror array in accordance with the preferred embodiment. The first step of the assembly process is to attach a glass pane 202 to a MEMS support plate 204. The glass pane is an optical grade glass, e.g., a BK-7 glass, preferably coated on both side with multi-wavelength anti-reflection coating. The glass is preferably mounted at an angle with respect to the MEMS plate that is larger than the largest mechanical angle of deflection for each single mirror. The attachment and sealing of the glass pane is performed using a material like, e.g., epoxy, braze, solder, or glass frit. The mirror array die is then attached to the MEMS support plate with a compliant material such as (but not limited to) epoxy, polyurethane (PUR), or silicone adhesive, which can act as strain relief for the chip. The MEMS support plate with the mirror array is then attached to the printed circuit (PC) board 206, or other interconnect board, e.g., but not limited to a flexible circuit board, or ceramic board, using an epoxy or other adhesive material. The PC board has a hole 208 in it, as shown in FIG. 38 (an exploded view of the package), which allows the MEMS support plate to be mounted through the PC board. In the case that polymer adhesives are undesirable in the package, this attachment could also be performed using other bonding techniques such as, e.g., eutectic bonding, thermocompression bonding of gold to gold, diffusion bonding, glass frit bonding, welding, brazing, or some form of solder reflow process. At this stage, the MEMS mirror array is connected electrically to the circuit board by wire bonding.

Figure 39:
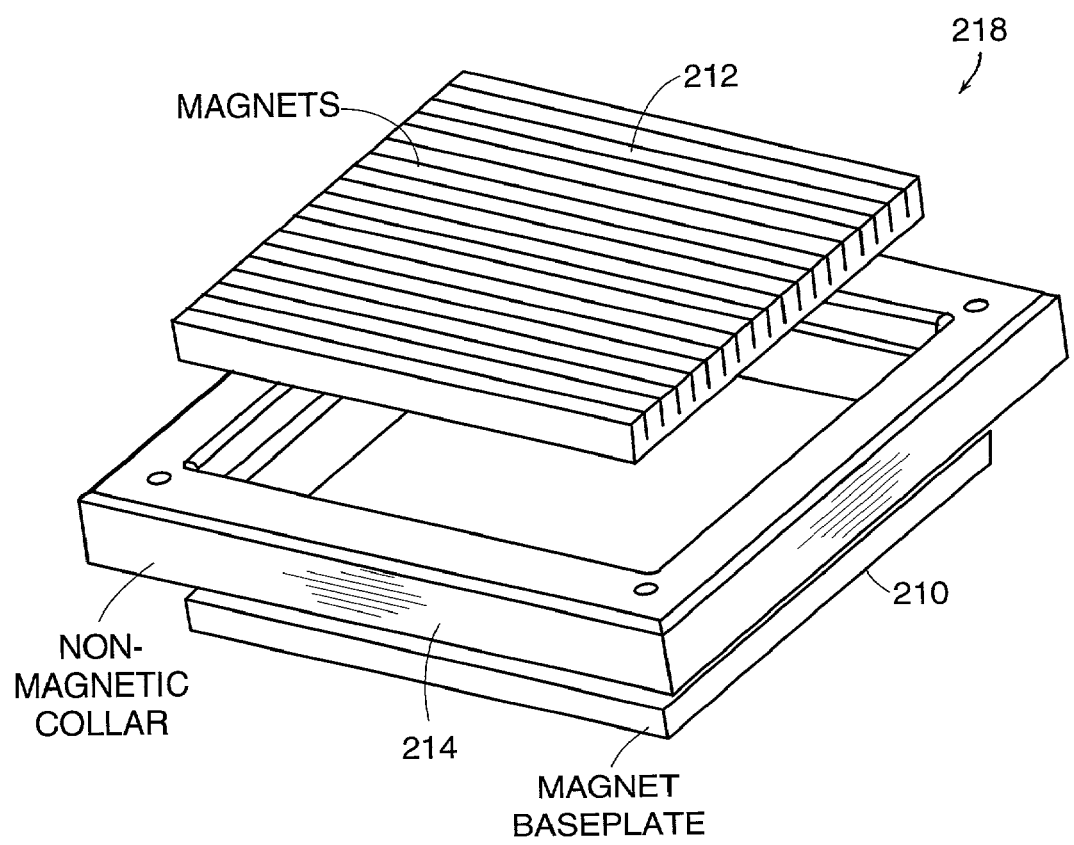
FIG. 39 is an exploded view of the magnet assembly in the mirror array package.

The magnet array includes a magnetic base plate 210, which is preferably fabricated from a soft magnetic material, e.g., Alloy 42 (ASTM F30), and permanent magnets 212, which are made of a material such as, e.g., samarium-cobalt or neodymium-iron-boron. The magnet array is then placed inside a non-magnetic collar 214, which, e.g., may be fabricated of aluminum. The collar 214 is used to provide a flat surface for final positioning of the magnets to the die. The entire magnet assembly 218, shown in FIG. 39, is then mounted into the magnet support plate 220, as shown in FIG. 37.

The magnet support plate 220 may have various forms. The simplest form of the magnet support plate simply allows the magnet array to be attached in a fixed position by epoxy adhesive, or other bonding techniques to the magnet support plate. If this method of attachment is selected, the attach process should be carried out at temperatures less than the curie temperature of the permanent magnets, or a temperature below the curie temperature where the magnet performance is degraded to an extent that it would not adversely affect the final mirror array performance.

Figure 40:
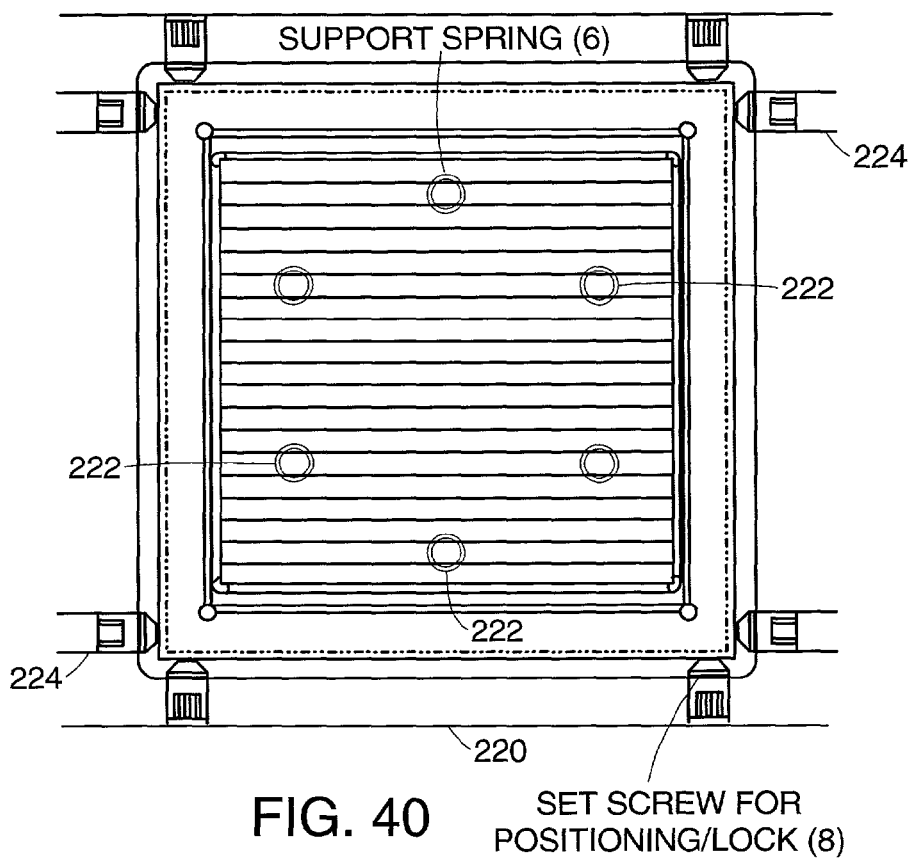
FIG. 40 is a plan view of a magnet support plate with a magnet assembly installed therein.
Figure 41:
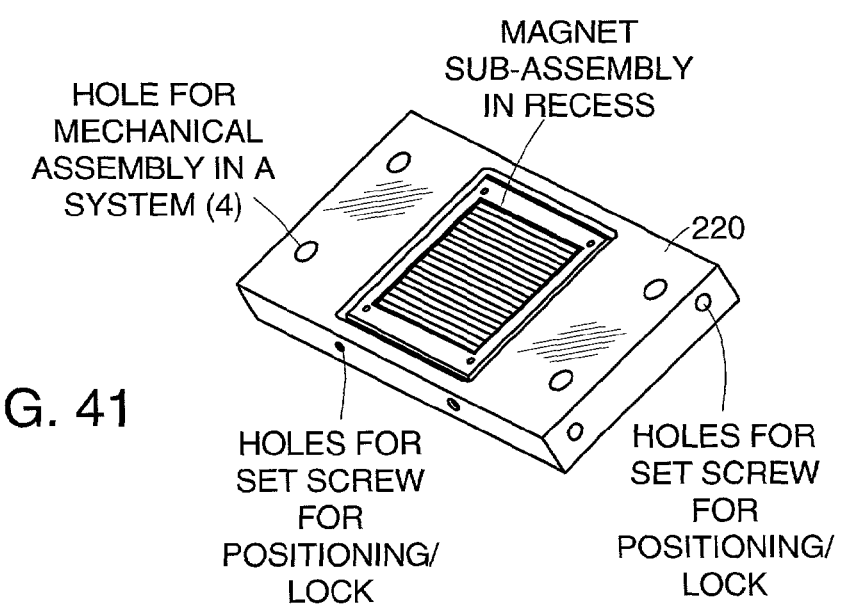
FIG. 41 is a perspective view of the magnet support plate with a magnet assembly installed therein.

The preferred embodiment of the magnet support plate 220 is shown in FIGS. 40 and 41. The magnet support plate 220 has springs 222 that press against the magnetic base plate and/or collar of magnet array. The support plate shown in FIGS. 40 and 41 has six springs, but this could be changed to any number and arrangement of springs needed to position the magnet assembly to the MEMS chip. The magnet support plate also preferably has set screws 224 that hold the magnet array in place, and can allow for active alignment of the magnet array to the mirror array. The support plate shown in FIGS. 40 and 41 has eight alignment set screws. The number and location of the set screws may be changed and is not limited to the particular arrangement shown. It would also be possible to remove some set screws and replace them with springs, so that set screws with opposing springs are used to hold the magnets in place. Alignment of the mirror array to the magnet array is performed after the assembly of the magnet assembly to the PC board with the mirror array.

Prior to attaching the magnet assembly to the PC board with the mirror array, a spacer is preferably placed between the mirror array and magnet array. This can be accomplished in one of several ways. The preferred way is to physically attach a spacer to the MEMS mirror array die, where no wire bonds are present and it is not covering the mirrors themselves. This spacer may be a material such as, but not limited to, a Teflon or polytetrafluorethylene (PTFE) tape, Kapton tape, polyimide or film, or a precision machined piece of metal. The preferred method applies the PTFE tape to the MEMS chip. Another method is to use a precision thickness tape with adhesive of a total thickness equal to one half of the desired gap. One piece of the tape is placed on the MEMS mirror array die, and a second on the magnet array, or collar. When the assembly is completed, the tape pieces on the two parts align and provide a defined area for sliding during the alignment of the magnets to the array. In accordance with a third method, the spacing is achieved by precision machining of the magnet assembly, the MEMS support plate, and the thickness of the PC board. These pieces are then assembled and the gap between the magnet array and the mirror array is not adjustable. A fourth embodiment of the magnet to mirror spacing would place small springs between the MEMS mirror array die, or the MEMS support plate, and the magnet array, or the magnet collar. These springs could be, e.g., leaf type springs, or coil springs. Adjustment screws positioned vertically through the magnet support plate would allow the vertical distance between the magnet array and the mirror array to be actively adjusted.

Mechanical fastening with, e.g., nuts and bolts, screws or an adhesive or bonding step completes the packaging assembly of the PC board to the magnet assembly. Precision assembly is not required due to the adjustment mechanisms preferably provided. The preferred embodiment attaches the PC board to the magnet assembly with an epoxy adhesive or, if required, a eutectic bond, while mechanical fasteners hold the assembly together during curing or bonding. After the packaging assembly is complete, the magnet array is aligned to the mirror array using the alignment screws if that embodiment of the magnet support plate was used.

Having described various preferred embodiments of the present invention, it should be apparent that modifications can be made without departing from the spirit and scope of the invention.

What is claimed is:

1. An array of electro-magnetically actuated MEMS devices, each device comprising:
   a mirror having a reflective surface;
   a gimbal structure for movably supporting said mirror about first and second axes;
   a first coil pair on the mirror for causing selective movement of said mirror about the first axis in the presence of a magnetic field; and
   a second coil pair on the mirror for causing selective movement of said mirror about the second axis in the presence of a magnetic field, each of said first and second coil pairs substantially filling the area of the mirror covered by the reflective surface.

2. The array of claim 1 wherein the first and second coil pairs are superposed on said mirror and are separated by a dielectric layer.

3. The array of claim 1 wherein the coils of the first coil pair are wound in opposite directions from each other, and wherein the coils of the second coil pair are wound in opposite directions from each other.

4. The array of claim 1 wherein the coils of the first coil pair are positioned on different sides of said first axis, and wherein the coils of the second coil pair are positioned on different sides of said second axis.

5. The array of claim 1 wherein the magnetic field is applied by an array of magnets of alternating polarity.

6. The array of claim 5 wherein one or more of said magnets are associated with each one of said devices.

7. The array of claim 5 wherein said magnets are arranged in a checkerboard pattern of alternating north and south poles.

8. The array of claim 5 wherein said magnets include a first set of magnets having poles perpendicular to a plane on which said array of MEMS devices is arranged, and a second set of magnets having poles parallel to said plane, and wherein said magnets of said first set are arranged between magnets of said second set.

9. The array of claim 1 wherein each device further comprises a feedback mechanism for determining the angular deflection of a respective mirror about one of said axes.

10. The array of claim 9 wherein said feedback mechanism comprises an excitation coil fixed relative to the device and a detection circuit for sensing the relative proximity of one of said coils to said excitation coil.

11. The array of claim 1 wherein the reflective surface is on an opposite side of said mirror from said coil pairs.

12. The array of claim 1 wherein the reflective surface and said coil pairs are on the same side of said mirror with the reflective surface generally covering said coil pairs.

13. A magnetically actuated mirror array apparatus, comprising:
an array of electro-magnetically actuated MEMS devices, each device comprising: a mirror having a reflective surface; a gimbal structure for movably supporting said mirror about first and second axes; a first coil pair on the mirror for causing selective movement of said mirror about the first axis in the presence of a magnetic field; and a second coil pair on the mirror for causing selective movement of said mirror about the second axis in the presence of a magnetic field, each of said first and second coil pairs substantially filling the area of the mirror covered by the reflective surface; and
an array of magnets positioned proximate said array of MEMS devices for applying the magnetic field, each magnet of said array being associated with one or more of said mirror devices.

14. The apparatus of claim 13 wherein said magnets are arranged in a checkerboard pattern of alternating north and south poles.

15. The apparatus of claim 13 wherein said magnets include a first set of magnets having poles perpendicular to a plane on which said array of MEMS devices is arranged, and a second set of magnets having poles parallel to said plane, and wherein said magnets of said first set are arranged between magnets of said second set.

16. The apparatus of claim 13 wherein each device further comprises a feedback mechanism for determining the angular deflection of a respective mirror about one of said axes.

17. The apparatus of claim 16 wherein said feedback mechanism comprises an excitation coil fixed relative to said device and a detection circuit for sensing the relative proximity of one of said coils to said excitation coil.

18. The apparatus of claim 13 wherein said reflective surface is on a side of said mirror opposite said coil pairs.

19. The apparatus of claim 13 wherein the reflective surface and said coil pairs are on the same side of said mirror with the reflective surface generally covering said coil pairs.

20. A magnetically actuated mirror array apparatus, comprising:
an array of mirror devices generally arranged in a plane, each mirror device comprising: a mirror; a gimbal structure for movably supporting said mirror about first and second axes; and actuation coils for causing selective movement of said mirror about the first and second axes; and
an array of magnets generally arranged in a plane proximate and parallel to said plane of said mirror device array, with each magnet being associated with one or more of said mirror devices, wherein said magnets include a first set of magnets having poles perpendicular to the plane of said mirror device array, and a second set of magnets having poles parallel to said plane of said mirror device array, and wherein said magnets of said first set are arranged between magnets of said second set.

21. The apparatus of claim 20 wherein said magnets are arranged in a checkerboard pattern of alternating north and south poles.

22. The apparatus of claim 20 wherein each device further comprises a feedback mechanism for determining the angular deflection of a respective mirror about one of said axes.

23. The apparatus of claim 22 wherein said feedback mechanism comprises an excitation coil and a detection circuit for sensing the relative proximity of one of said coils to said excitation coil.

24. A MEMS apparatus comprising:
an array of electromagnetically actuated MEMS devices arranged in rows on a substrate; and
an array of magnets positioned along a plane parallel to said substrate, said array of magnets including magnets along each row of devices having a pole direction parallel to said substrate, and magnets between each row of devices having a pole direction perpendicular to said substrate such that said devices are within a magnetic field produced by said array of magnets.

25. The apparatus of claim 24 wherein said MEMS devices each comprise:
a mirror having a reflective surface;
a gimbal structure for movably supporting said mirror about first and second axes;
a first coil pair on the mirror for causing selective movement of said mirror about the first axis in the presence of the magnetic field; and
a second coil pair on the mirror for causing selective movement of said mirror about the second axis in the presence of the magnetic field,
each of said first and second coil pairs substantially filling the area of the mirror covered by the reflective surface.

26. The apparatus of claim 25 wherein said reflective surface is on a side of said mirror opposite said coil pairs.

27. The apparatus of claim 25 wherein the reflective surface and said coil pairs are on the same side of said mirror with the reflective surface generally covering said coil pairs.

28. An electro-magnetically actuated MEMS device, comprising:

a mirror having a reflective surface;

a gimbal structure for movably supporting said mirror about first and second axes;

a first coil pair on the mirror for causing selective movement of said mirror about the first axis in the presence of a magnetic field; and a second coil pair on the mirror for causing selective movement of said mirror about the second axis in the presence of a magnetic field, each of said first and second coil pairs substantially filling the area of the mirror covered by the reflective surface.

29. The device of claim 28 wherein the first and second coil pairs are superposed on said mirror and are separated by a dielectric layer.

30. The device of claim 28 wherein the coils of the first coil pair are wound in opposite directions from each other, and wherein the coils of the second coil pair are wound in opposite directions from each other.

31. The device of claim 28 wherein the coils of the first coil pair are positioned on different sides of said first axis, and wherein the coils of the second coil pair are positioned on different sides of said second axis.

32. The device of claim 28 wherein the magnetic field is applied by one or more external magnets.

33. The device of claim 28 further comprising a feedback mechanism for determining the angular deflection of the mirror about one of said axes.

34. The device of claim 33 wherein said feedback mechanism comprises an excitation coil fixed relative to the device and a detection circuit for sensing the relative proximity of one of said coils to said excitation coil.

35. The device of claim 28 wherein said reflective surface is on a side of said mirror opposite said coil pairs.

36. An electro-magnetically actuated MEMS mirror array apparatus, comprising:

(a) an array of mirror devices, each comprising:

a mirror having a reflective surface;

a gimbal frame for movably supporting said mirror about first and second axes;

a first coil on the mirror; and a second coil on the gimbal frame, said first and second coils for causing selective movement of said mirror about the first and second axes in the presence of a magnetic field, said first coil substantially filling the area of the mirror covered by the reflective surface; and (b) an array of magnets positioned proximate said devices for applying the magnetic field, each magnet of said array being associated with one or more of said mirror devices, wherein said magnets have poles parallel to a plane on which said array of mirror devices is arranged.

37. The apparatus of claim 36 wherein said first coil is on a side of said mirror opposite said reflective surface.

38. The apparatus of claim 36 wherein the reflective surface and said first coil is on the same side of said mirror with the reflective surface generally covering said second coil.

39. An electro-magnetically actuated MEMS mirror array apparatus, comprising:

(a) an array of mirror devices, each comprising:

a mirror having a reflective surface;

a gimbal frame for movably supporting said mirror about first and second axes;

a first coil on the mirror; and a second coil on the gimbal frame, said first and second coils for causing selective movement of said mirror about the first and second axes in the presence of a magnetic field, said first coil substantially filling the area of the mirror covered by the reflective surface; and (b) an array of magnets positioned proximate said devices for applying the magnetic field, each magnet of said array being associated with one or more of said mirror devices, wherein said magnets include a first set of magnets having poles perpendicular to a plane on which said array of mirror devices is arranged, and a second set of magnets having poles parallel to said plane, and wherein said magnets of said first set are arranged between magnets of said second set.

40. The apparatus of claim 39 wherein said first coil is on a side of said mirror opposite said reflective surface.

41. The apparatus of claim 39 wherein the reflective surface and said first coil is on the same side of said mirror with the reflective surface generally covering said second coil.

* * * * *